(12) United States Patent
Lee et al.

(10) Patent No.: US 11,143,891 B2
(45) Date of Patent: Oct. 12, 2021

(54) DISPLAY DEVICE

(71) Applicant: SAMSUNG DISPLAY CO., LTD., Yongin-si (KR)

(72) Inventors: Chang Han Lee, Cheonan-si (KR); Myung Hwan Kim, Yongin-si (KR); Sang Yeol Kim, Hwaseong-si (KR); Woo Hyun Kim, Hwaseong-si (KR); Hyo Jin Kim, Suwon-si (KR); Kyoung Il Min, Hwaseong-si (KR); Tae Hyun Sung, Seoul (KR); Se Joong Shin, Cheonan-si (KR); Ho Ryun Chung, Suwon-si (KR); Jae Cheol Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/390,153

(22) Filed: Apr. 22, 2019

(65) Prior Publication Data

US 2020/0004077 A1 Jan. 2, 2020

(30) Foreign Application Priority Data

Jun. 28, 2018 (KR) ........................ 10-2018-0074882

(51) Int. Cl.
*G02F 1/1333* (2006.01)
*H01L 51/00* (2006.01)
(Continued)

(52) U.S. Cl.
CPC .... *G02F 1/133305* (2013.01); *H01L 27/3232* (2013.01); *H01L 51/0097* (2013.01);
(Continued)

(58) Field of Classification Search
CPC ......... H01L 2251/5338; H01L 51/0097; G02F 1/133305; G02F 2202/28
See application file for complete search history.

(56) References Cited

U.S. PATENT DOCUMENTS

| | | | |
|---|---|---|---|
| 2014/0092339 A1 | 4/2014 | Yoshimura et al. | |
| 2016/0209877 A1* | 7/2016 | Chong | ................ H01L 27/1248 |

(Continued)

FOREIGN PATENT DOCUMENTS

| | | |
|---|---|---|
| EP | 3 255 482 | 12/2017 |
| EP | 3 255 690 | 12/2017 |

(Continued)

OTHER PUBLICATIONS

European Search Report dated Feb. 17, 2020 issued in corresponding European Application No. EP19182460.6.

*Primary Examiner* — Mariam Qureshi
(74) *Attorney, Agent, or Firm* — F. Chau & Associates, LLC

(57) ABSTRACT

A display device including: a display panel including a first area, a second area spaced apart from the first area, and a bent third area between the first and second areas; a first support film coupled to a bottom surface of the display panel and overlapping the first area; and a second support film coupled to the bottom surface of the display panel, overlapping the second area, and spaced apart from the first support film by a gap, the gap overlapping the third area, a top surface of the first support film facing the display panel and an inner side of the first support film form a first angle, a top surface of the second support film facing the display panel and an inner side of the second support film form a second angle, which is greater than the first angle, and the first support film includes a protruding pattern.

22 Claims, 19 Drawing Sheets

(51) Int. Cl.
    *H01L 27/32*     (2006.01)
    *H01L 51/52*     (2006.01)
    *H05K 1/02*     (2006.01)

(52) U.S. Cl.
    CPC ...... *H01L 51/5203* (2013.01); *H01L 51/5237* (2013.01); *H05K 1/028* (2013.01)

(56) References Cited

U.S. PATENT DOCUMENTS

| | | | | |
|---|---|---|---|---|
| 2016/0338219 | A1* | 11/2016 | Seo | G06F 1/1652 |
| 2017/0045914 | A1* | 2/2017 | Namkung | G06F 1/1652 |
| 2017/0179423 | A1* | 6/2017 | Kwon | H01L 51/5237 |
| 2017/0293194 | A1* | 10/2017 | Hou | G02F 1/167 |
| 2018/0180911 | A1* | 6/2018 | Odaka | H01L 51/0097 |

FOREIGN PATENT DOCUMENTS

| | | |
|---|---|---|
| KR | 10-2017-0084402 | 7/2017 |
| KR | 10-2017-0128789 | 11/2017 |
| KR | 10-2017-0137984 | 12/2017 |
| KR | 10-2017-0140490 | 12/2017 |
| KR | 10-2017-0141851 | 12/2017 |
| KR | 10-2018-0000039 | 1/2018 |
| KR | 10-2018-0029739 | 3/2018 |

* cited by examiner

DISPLAY DEVICE

CROSS-REFERENCE TO RELATED APPLICATION

This application claims priority under 35 U.S.C. § 119 to Korean Patent Application No. 10-2018-0074882, filed on Jun. 28, 2018, in the Korean Intellectual Property Office, the disclosure of which is incorporated by reference herein in its entirety.

TECHNICAL FIELD

The present inventive concept relates to a display device.

DESCRIPTION OF THE RELATED ART

A display device is a device that displays an image signal. Examples of the display device include a television (TV), a computer monitor, a personal digital assistant (PDA), and a smartphone.

A high-quality flat panel-type display module such as an organic light-emitting diode (OLED) display panel, a liquid crystal display (LCD) panel, a plasma display panel (PDP), or an electrophoretic display (EPD) panel can be used in the display device.

In recent years, a flexible display device that is bendable or foldable has been developed. The flexible display device may be realized using a flexible substrate such as a plastic substrate.

SUMMARY

An exemplary embodiment of the present inventive concept provides a display device including a display panel including a first area, which includes a display area, a second area, which is spaced apart from the first area in a first direction, and a third area, which is disposed between the first area and the second area, the third area being bent; a first support film coupled to a bottom surface of the display panel and overlapping the first area; and a second support film coupled to the bottom surface of the display panel, overlapping the second area, and spaced apart from the first support film by a gap, the gap overlapping the third area, wherein the first support film and the second support film include different materials from each other, a top surface of the first support film facing the display panel and an inner side of the first support film form a first angle, the inner side of the first support film being disposed alongside the gap, a top surface of the second support film facing the display panel and an inner side of the second support film form a second angle, which is greater than the first angle, the inner side of the second support film being disposed alongside the gap, and the first support film includes, near the gap, a protruding pattern protruding beyond a bottom surface of the first support film.

An exemplary embodiment of the present inventive concept provides a display device including a display panel including a first area, which includes a display area, a second area, which is spaced apart from the first area in a first direction, and a third area, which is disposed between the first and second areas and is bent; a first support film coupled to a bottom surface of the display panel and overlapping the first area; a second support film coupled to the bottom surface of the display panel, overlapping the second area, and spaced apart from the first support film by a gap, wherein the gap overlaps the third area; and a carbide disposed between the bottom surface of the display panel and the second support film.

An exemplary embodiment of the present inventive concept provides a display device including a display panel including a first area, which includes a display area, a second area, which is spaced apart from the first area in a first direction, and a third area, which is disposed between the first and second areas and is bent; a first support film coupled to a bottom surface of the display panel and overlapping the first area; a second support film coupled to the bottom surface of the display panel, overlapping the second area, and spaced apart from the first support film by a gap, wherein the gap overlaps the third area; a first bonding layer disposed between the u display panel and the first support film; and a second bonding layer disposed between the display panel and the second support film and spaced apart from the first bonding layer, wherein a first angle that a top surface of the first bonding layer facing the display panel and an inner side of the first bonding layer near the gap form with each other is different from a second angle that a top surface of the second bonding layer facing the display panel and an inner side of the second bonding layer near the gap form with each other.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION OF THE EMBODIMENTS

Figure 1:
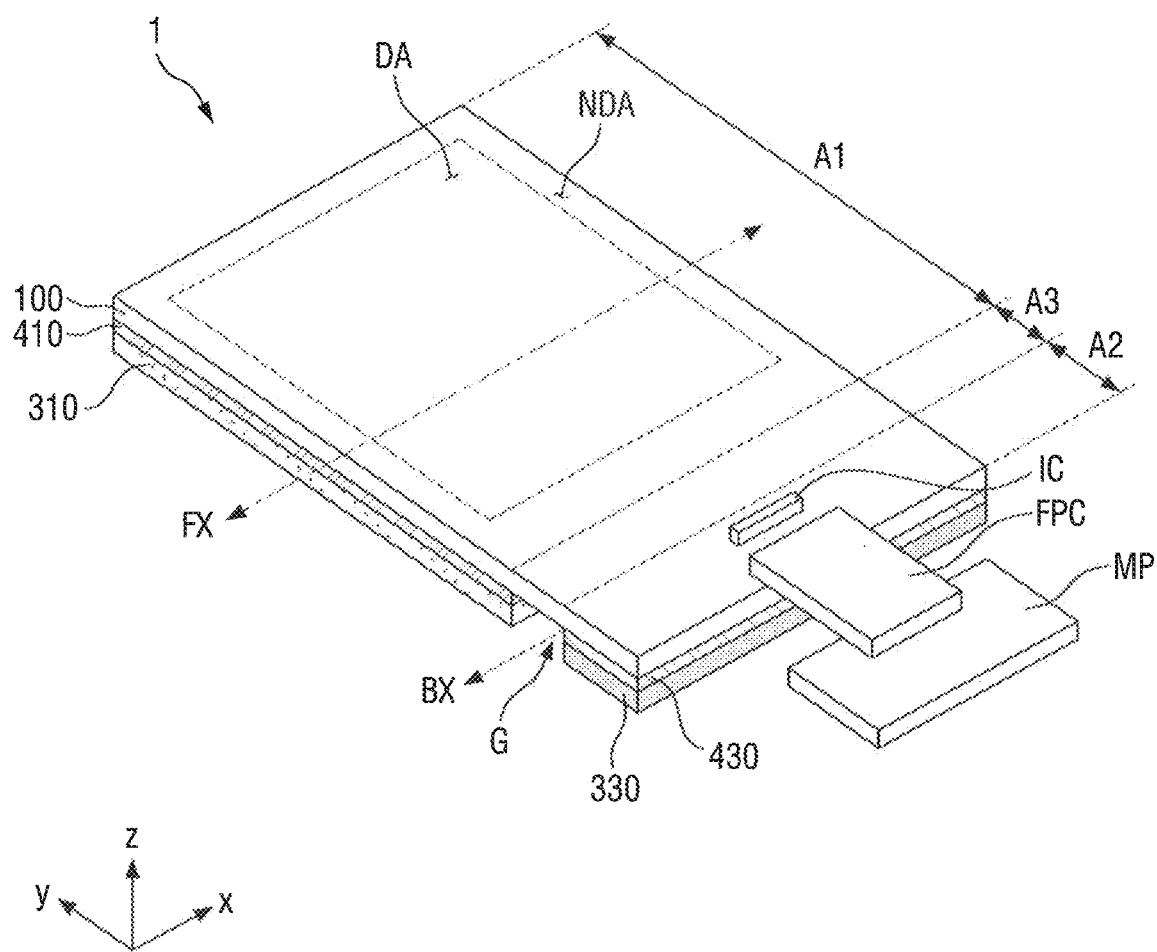
FIG. 1 is a perspective view of a display device according to an exemplary embodiment of the present inventive concept.

Exemplary embodiments of the present inventive concept will be described more fully hereinafter with reference to the accompanying drawings. The present inventive concept may, however, be embodied in many different forms and should not be construed as being limited to the embodiments set forth herein. Like reference numerals may refer to like elements throughout the specification.

As used herein, the singular forms "a", "an" and "the" are intended to include the plural forms as well, unless the context clearly indicates otherwise.

It will be understood that when an element or layer is referred to as being "on", "connected to" or "coupled to" another element or layer, it can be directly on, connected or coupled to the other element or layer or intervening elements or layers may be present.

Figure 2:
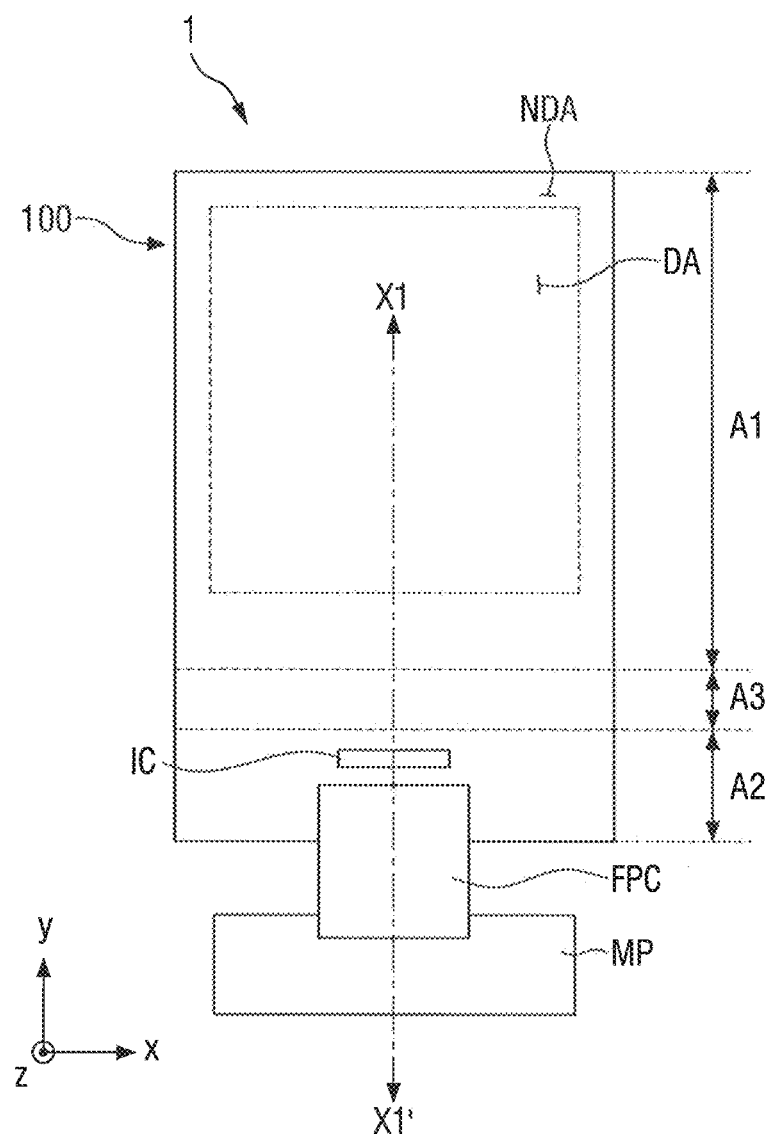
FIG. 2 is a plan view of the display device of FIG. 1 according to an exemplary embodiment of the present inventive concept.
Figure 3:
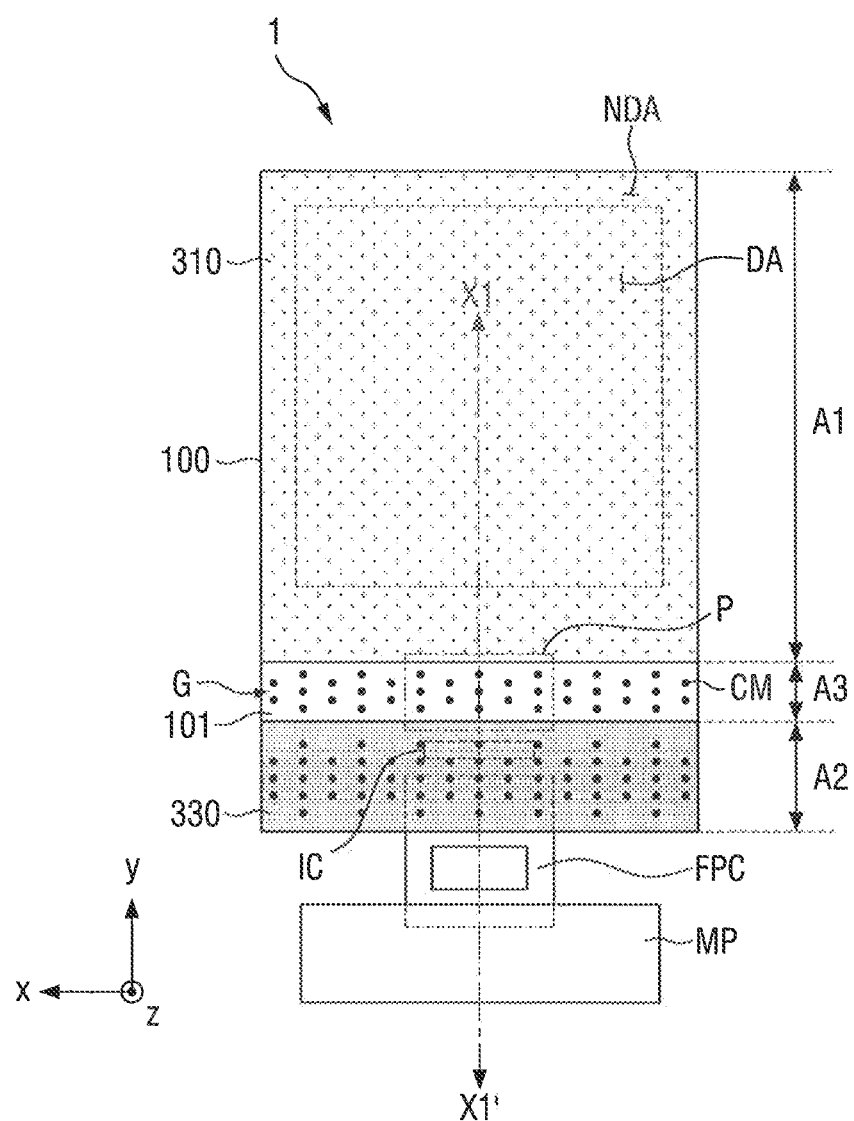
FIG. 3 is a rear view of the display device of FIG. 1 according to an exemplary embodiment of the present inventive concept.
Figure 4:
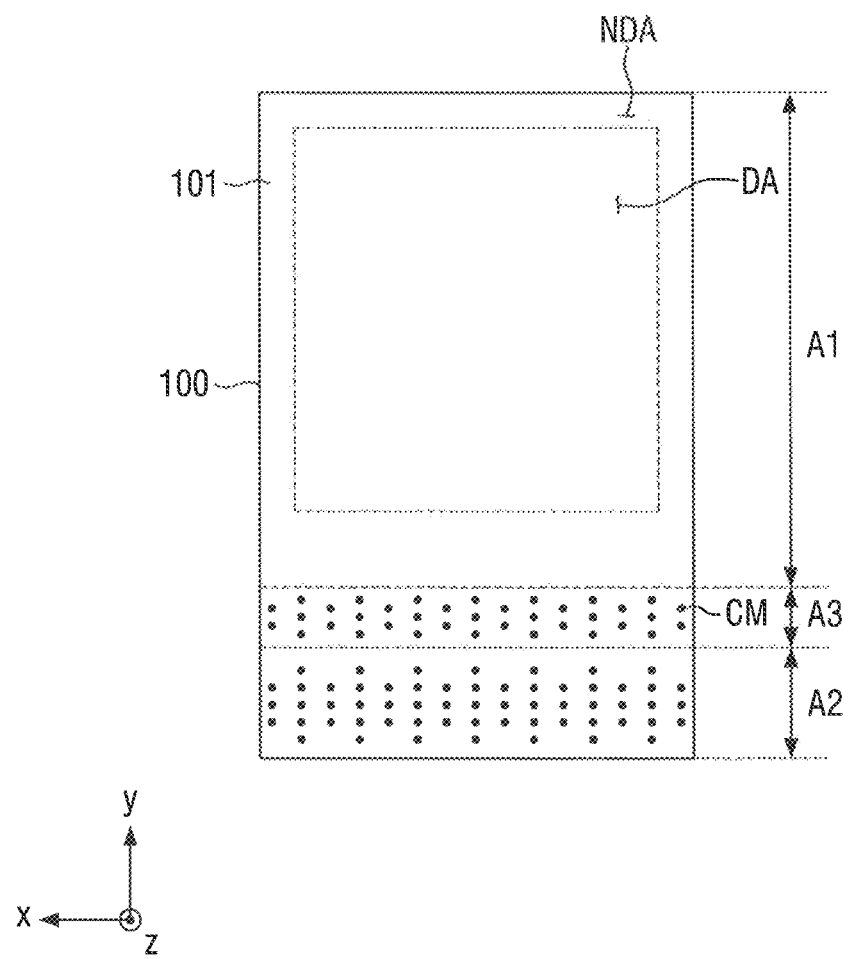
FIG. 4 is a rear view illustrating a display panel and a carbide of the display device of FIG. 3 according to an exemplary embodiment of the present inventive concept.
Figure 5:
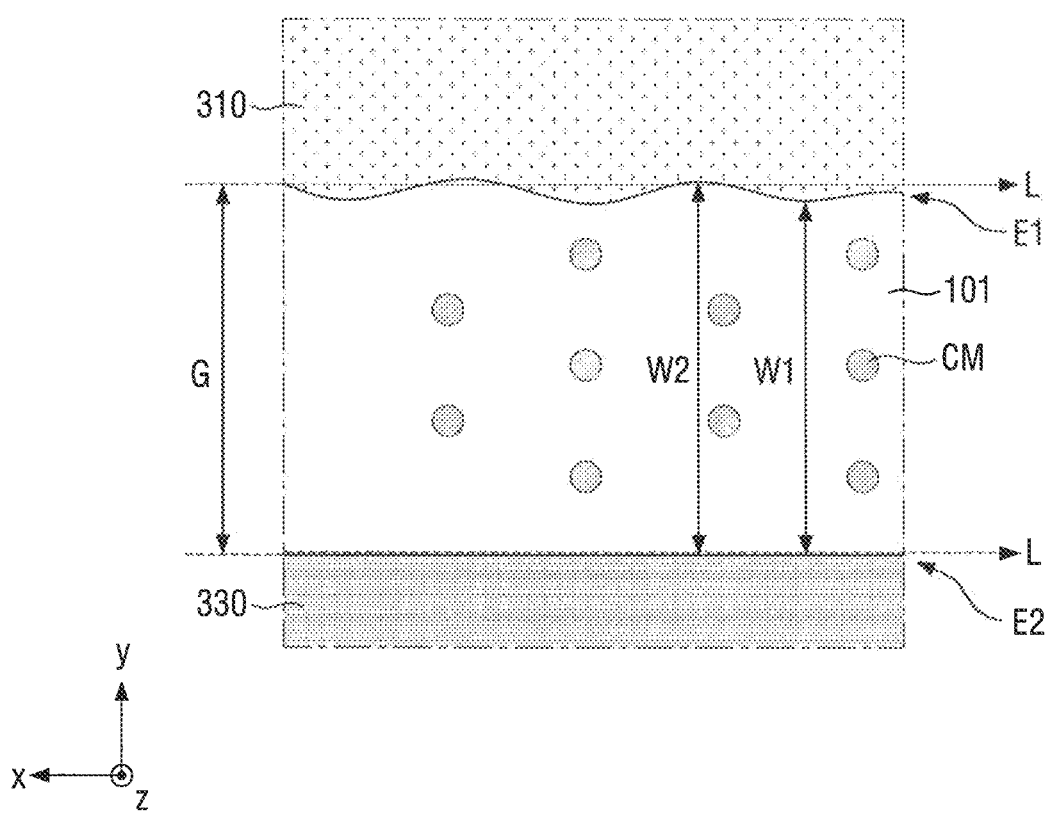
FIG. 5 is an enlarged view illustrating a part P of FIG. 3 according to an exemplary embodiment of the present inventive concept.

FIG. 1 is a perspective view of a display device according to an exemplary embodiment of the present inventive concept, FIG. 2 is a plan view of the display device of FIG. 1, FIG. 3 is a rear view of the display device of FIG. 1, FIG. 4 is a rear view illustrating a display panel and a carbide of the display device of FIG. 3, and FIG. 5 is an enlarged view illustrating a part P of FIG. 3. Specifically, FIGS. 1 through 5 illustrate a display device yet to be bent or folded. In other words, the display device in FIGS. 1 to 5 is in an unbent or unfolded state.

Referring to FIGS. 1 through 5, a display device 1 may be applicable to a mobile terminal. Examples of the mobile terminal include a tablet personal computer (PC), a smartphone, a personal digital assistant (PDA), a portable multimedia player (PMP), a game console, a wristwatch-type electronic device, and the like. However, the display device 1 is not limited thereto. In other words, the display device 1 may also be used in a large-size electronic device such as a television (TV) or an external billboard, and also in a mid- to small-size electronic device such as a PC, a notebook a computer, a car navigation device, or a camera.

In exemplary embodiments of the present inventive concept, the display device 1 may have a rectangular shape in a plan view. The display device 1 may have two short sides extending in a first direction x and two long sides extending in a second direction y. The corners where the long sides and the short sides of the display device 1 meet may be right-angled, but the present inventive concept is not limited thereto, in other words, alternatively, the corners of the display device 1 may be rounded. The planar shape of the display device 1 is not particularly limited, and the display device 1 may also be formed in a circular shape or another shape.

The display device 1 may include a display panel 100, a first support film 310, a second support film 330, a first bonding, layer 410, a second bonding layer 430, and a carbide CM.

The display panel 100 may be divided into a display area DA in which an image is displayed and a non-display area NDA in which no image is displayed. The non-display area NDA may be disposed in the periphery of the display area DA. In exemplary embodiments of the present inventive concept, the non-display area NDA may surround the display area DA.

The display device 100 may also be divided into a first area A1 which includes the display area DA, a second area A2 which is spaced apart from the first area A1 in the second direction y, and a third area A3 which is disposed between the first and second areas A1 and A2 and is bendable.

The first area A1 may include the display area DA and a part of the non-display area NDA. In exemplary embodiments of the present inventive concept, the part of the non-display area NDA included in the first area A1 may surround the display area DA.

In exemplary embodiments of the present inventive concept, the first area A1 may be foldable. The first area A1 can be folded upwardly or downwardly along a folding axis FX extending in the first direction x. The terms "upper," "top," "top surface," and "upper side," as used herein, may refer to a display surface of the display panel 100, e.g., a third direction z, and the terms "lower," "bottom," "bottom surface," and "lower side," as used herein, may refer to the other surface of the display panel 100 opposite to the display surface, e.g., the opposite direction of the third direction z.

The second area A2 may be another part of the non-display area NDA. The second area A2 may be spaced apart from the first area A1 in the second direction y with the third area A3 interposed therebetween. A driving chip integrated circuit (IC) may be mounted in the second area A2, and a flexible printed circuit board FPC may be connected to the second area A2. In exemplary embodiments of the present inventive concept, pads connected to the driving chip IC and pads connected to the flexible printed circuit board FPC may be disposed in the second area A2.

The third area A3 may be disposed between the first and second areas A1 and A2. In exemplary embodiments of the present inventive concept, the third area A3 may be another part of the non-display area NDA. The third area A3 may extend in the first direction x across the non-display area NDA. In exemplary embodiments, the display panel 100 may be bent in the third area A3 along a bending axis BX extending in the first direction x. The display panel 100 may stay bent in the third area A3 in a final product state. In exemplary embodiments of the present inventive concept, the display panel 100 may be bent downwardly in the third area A3 along the bending axis BX. As the display panel 100 is bent downwardly in the non-display area DA, the size of the non-display area NDA of the display device 1, as viewed from above the display device 1, can be reduced. In addition, the bezel width of the display device 1 can also be reduced.

In some exemplary embodiments, the display panel 100 may be bendable or fordable in the third area A3 along the bending axis BX. In some exemplary embodiments, the display panel may be deformed between a bent shape and a non-bent shape in the final product state. In some exemplary embodiments, the display panel may be deformed between a folded shape and a non-folded shape in the final product state.

In exemplary embodiments of the present inventive concept, the display panel 100 may be a display panel including self-luminous elements. In an exemplary embodiment of the present inventive concept, the self-luminous elements may include organic light-emitting diodes (OLEDs), quantum dot light-emitting diodes (QLEDs), inorganic material-based micro light-emitting diodes (micro LEDs), and/or inorganic material-based nano light-emitting diodes (nano LEDs). For convenience, it is assumed that the self-luminous elements are OLEDs, and the self-luminous elements of the display panel 100 will be described later.

The driving chip IC may be mounted in the second area A2 of the display panel 100. In exemplary embodiments of the present inventive concept, the driving chip IC may include at least one of a data driver for applying data signals to data lines, a gate driver for applying gate signals to gate lines, and a signal controller for controlling the operations of the data driver and the gate driver. Only one driving chip IC is illustrated, but the number of driving chips IC provided in the display panel 100 is not limited thereto.

In exemplary embodiments of the present inventive concept, the driving chip IC may be mounted on the display panel 100 in a chip-on-plastic (CoP) manner. In exemplary embodiments of the present inventive concept, the driving chip IC may be mounted on the display panel 100 using a pressurizing device. In exemplary embodiments of the present inventive concept, the driving chip IC may be mounted on the display panel 100 via an anisotropic conductive film (ACF) or via ultrasonic bonding. Ultrasonic bonding is a technique of bonding two metals by applying pressure and ultrasonic vibration. When the driving chip IC is mounted on the display panel 100 via ultrasonic bonding, processes of pressing the driving chip IC and applying ultrasonic vibration may be performed. However, the present inventive concept is not limited to the above described exemplary embodiments. In other words, in other exemplary embodiments of the present inventive concept, the driving chip IC may be mounted on the flexible printed circuit board FPC in the form of a chip-on-film (COF).

The flexible printed circuit board FPC may be connected to the second area A2 of the display panel 100. In exemplary embodiments of the present inventive concept, the flexible printed circuit board FPC may be connected to the pads provided in the display panel 100 via an ACF. In exemplary embodiments of the present inventive concept, the connecting of the flexible printed circuit board FPC to the display panel 100 may include a process of applying pressure to the flexible printed circuit board FPC.

A main circuit board MP may be electrically connected to the display panel 100 via the flexible printed circuit board FPC and may transmit signals to, or receive signals from, the driving chip IC. The main circuit board MP may provide image data, control signals, and power supply voltages to the display panel 100 or the flexible printed circuit board FPC. The main circuit board MP may include active elements and passive elements.

The first and second support films 310 and 330 may be disposed below the display panel 100. In exemplary embodiments of the present inventive concept, the first and second support films 310 and 330 may be bonded to a bottom surface 101 of the display panel 100 and may be spaced apart from each other by a gap G.

The first and second support films 310 and 330 may support the display panel 100, which has flexibility, and may protect the bottom surface 101 of the display panel 100.

The first support film 310 may be coupled to the bottom surface 101 of the display panel 100 in the first area A1, and the second support film 330 may be coupled to the bottom surface 101 of the display panel 100 in the second area A2.

The first and second support films 310 and 330 may not be disposed in the third area A3. As mentioned above, the third area A3 is a bendable area. Thus, the gap G, which overlaps with the third area A3, may be formed between the first and second support films 310 and 330 to form a small curvature radius. In exemplary embodiments of the present inventive concept, in the third area A3, the bottom surface 101 of the display panel 100 may not be covered, but may be exposed, between the first and second support films 310 and 330.

In exemplary embodiments of the present inventive concept, the tensile modulus or Young's modulus of the second support film 330 may be greater than the tensile modulus or Young's modulus of the first support film 310. As described above, when the driving chip IC is mounted in the second area A2 of the display panel 100, pressure can be applied to the second area A2. Since the second support film 330, which is disposed on a part of the bottom surface 101 of the display panel 100 corresponding to the second area A2, has a larger tensile elastic modulus than the first support film 310, wiring in the non-display area NDA can be prevented from cracking due to the pressure applied when mounting the driving chip IC. In addition, since the first support film 310 having a relatively small tensile modulus is disposed on a part of the bottom surface 101 of the display panel 100 corresponding to the first area A1, the display panel 100 can be folded with ease.

The first and second support films 310 and 330 may comprise different materials. In exemplary embodiments of the present inventive concept, the second film 330 may comprise polyethylene terephthalate (PET), polycarbonate (PC), or polymethyl methacrylate (PMMA), and the first support film 310 may comprise polyethylene naphthalate (PEN), polyimide (PI), polyethylene sulfide (PES), polyamide (PA), or aramid. For example, the second support film 330 may comprise PET, and the first support film 310 may comprise PI.

In exemplary embodiments of the present inventive concept, the transmittance of the second support film 330 may be higher than the transmittance of the first support film 310. For example, the transmittance of the second support film 330 may be about 80% or higher, and the transmittance of the first support film 310 may be about 60% or lower.

In the second area A2 to which the second support film 330 is coupled, the driving chip IC is mounted on the display panel 100 via high-pressure bonding. A test may be conducted with the use of an optical microscope or the like to determine whether the driving chip IC is well mounted on the display panel 100. In exemplary embodiments of the present inventive concept, since the second support film 330 having a relatively high light transmittance is disposed in the second region A2 where the driving chip IC is mounted, the driving chip IC can be properly tested for its mounting state.

In exemplary embodiments of the present inventive concept, the first and second support films 310 and 330 may have different colors. For example, the second support film 330 may be colorless and transparent, and the first support film 310 may be yellowish.

In exemplary embodiments of the present inventive concept, the glass transition temperature (Tg) of the second support film 330 may be 100° C. or lower, and the glass transition temperature (Tg) of the first support film 310 may be 150° C. or higher.

As mentioned above, the first area A1 where the first support film 310 is disposed is foldable along the folding axis FX. In a case where a support film formed of a polymer material such as PET is disposed in the first region A1, since the first region A1 is foldable, there may be an issue in connection with environmental reliability. Here, environmental reliability may refer to the display panel 100's characteristic of maintaining its neutral plane and not being broken in a high-temperature environment (e.g., at a temperature of 60° C. to 85° C.) when bending or folding the display panel 100.

PET has a glass transition temperature (Tg) of about 78° C. Thus, if the first and second support films 310 and 330 are formed of a polymer material such as PET, an issue associated with environmental reliability may arise when the display panel 100 is bent or folded. In accordance with an exemplary embodiment of the present inventive concept, the second support film 330 having a relatively high transmittance is used in the second area A2 where the driving chip IC is disposed and the first support film 310 having a relatively low transmittance, but having a relatively high glass transition temperature (Tg), is used in the first area A1 including the display area DA, which is foldable. Therefore, the issue of environment reliability and the occurrence of defects that may be caused by the pressing of the driving chip IC, can be alleviated.

The first bonding layer 410 may be disposed between the first support film 310 and the bottom surface 101 of the display panel 100. The first support film 310 may be coupled to the display panel 100 via the first bonding layer 410. The second bonding layer 430 may be disposed between the second support film 330 and the bottom surface 101 of the display panel 100. The second support film 330 may be coupled to the display panel 100 via the second bonding layer 430.

The first bonding layer 410 may be in contact with the bottom surface 101 of the display panel 100 in the first area A1 and may not be disposed in the second and third areas A2 and A3.

The second bonding layer 430 may be in contact with the bottom surface 101 of the display panel 100 in the second area A2 and may not be disposed in the first and third areas A1 and A3.

The first and second bonding layers 410 and 430, like the first and second support films 310 and 330, may be spaced apart from each other by the gap G.

The first and second bonding layers 410 and 430 may comprise different materials. For example, the first bonding layer 410 may be formed of a silicone-based resin, and the second bonding layer 430 may be formed of an acrylic resin.

In exemplary embodiments of the present inventive concept, the first bonding layer 410 may be more flexible than the second bonding layer 430. Since the first bonding layer 410, which is coupled to the first area A1 of the display panel 100, is relatively flexible, the display panel 100 can be folded with ease.

In exemplary embodiments of the present inventive concept, the adhesion of the first bonding layer 410 and the adhesion of the second bonding layer 430 may be different. For example, the adhesion of the second bonding layer 430 may be stronger than the adhesion of the first bonding layer 410.

In exemplary embodiments of the present inventive concept, the storage modulus of the second bonding layer 430 may be greater than the storage modulus of the first bonding layer 410. Since the second bonding layer 430, which is coupled to the second area A2 of the display panel 100, has a relatively large storage modulus, cracking that may be caused by pressure in the process of mounting the driving chip IC can be prevented.

The gap G may be formed between the first and second support films 310 and 330 to correspond to the third area A3 of the display panel 100. Accordingly, in the third area A3, a part of the bottom surface 101 of the display panel 100 may be exposed through the gap G.

In exemplary embodiments of the present inventive concept, the formation of the gap G and the formation of the first support film 310 may include a laser irradiation process. The second bonding layer 430 and the second support film 330 may be coupled to the display panel 100 after the laser irradiation process. Accordingly, in exemplary embodiments of the present inventive concept, as illustrated in FIG. 5, an edge E1 of the first support film 310 near the gap G may extend in the first direction x, and may be slightly undulated with respect to a straight line L that is parallel to the first direction x. The edge E1 of the first support film 310 may be formed by the laser irradiation process, and an edge E2 of the second support film 330 near the gap G may be formed by a cutting process using a cutting knife. Accordingly, the edge E1 of the first support film 310 and the edge E2 of the second support film 330 may have different planar shapes. For example, the edge E1 of the first support film 310 may be wave-like and the edge E2 of the second support film 330 may be flat.

The edge E1 of the first support film 310 may be an edge of the top surface of the first support film 310, and the edge E2 of the second support film 330 may be an edge of the top is surface of the second support film 330.

In exemplary embodiments of the present inventive concept, the distance between the edge E1 of the first support film 310 and the edge E2 of the second support film 330 may not be uniform. Accordingly, the width, in the second direction y, of the part of the bottom surface 101 of the display panel 100 exposed through the gap G may not be uniform. For example, the bottom surface 101 of the display panel 100 may include a part having a first width W1 in the second direction y and a part having a second width W2 in the second direction y, and the first and second widths W1 and W2 may be different.

In exemplary embodiments of the present inventive concept, the first support film 310 may further include a protruding pattern. The protruding pattern may be a burr pattern BU. The burr pattern BU (see FIG. 6) may be disposed near the gap G. A part of the first support film 310 may be melted by the thermal energy of laser light applied in the laser irradiation process, and as a result, the burr pattern BU may be formed. The burr pattern BU may protrude more downward than the bottom surface of the first support film 310, which is substantially parallel to the bottom surface 101 of the display panel 100. In exemplary embodiments of the present inventive concept, the burr pattern BU may extend in the same direction as the gap G, e.g., the first direction x.

In exemplary embodiments of the present inventive concept, the second support film 330, unlike the first support film 310, may not include a burr pattern. BU disposed near the gap G.

In exemplary embodiments of the present inventive concept, the carbide CM may be disposed in parts of the bottom surface 101 of the display panel 100 corresponding to the second and third areas A2 and A3. Parts of the bottom surface 101 may be carbonized in the laser irradiation process, or parts of the bonding layer disposed in the second and third areas A2 and A3 may be carbonized in the process of forming the first bonding layer 410. As a result, the carbide CM may be formed.

In the third area A3, the carbide CM may be exposed through the gap G and may be in contact with the bottom surface 101 of the display panel 100. In the second area A2, the carbide GM may be in contact with the bottom surface 101 of the display panel 100 and may be disposed between the display panel 100 and the second support film 330.

The carbide CM may not be disposed in the first area A1. In other words, in the first area A1, the bottom surface 101 of the display panel 100 may not be in contact with the carbide CM. In other words, when the display panel 100 is unfolded, the carbide CM may not overlap with the first area A1 of the display panel 100, but also with the display area DA.

The display device 1 will hereinafter be described in further detail with reference to FIGS. 6 through 9.

Figure 6:
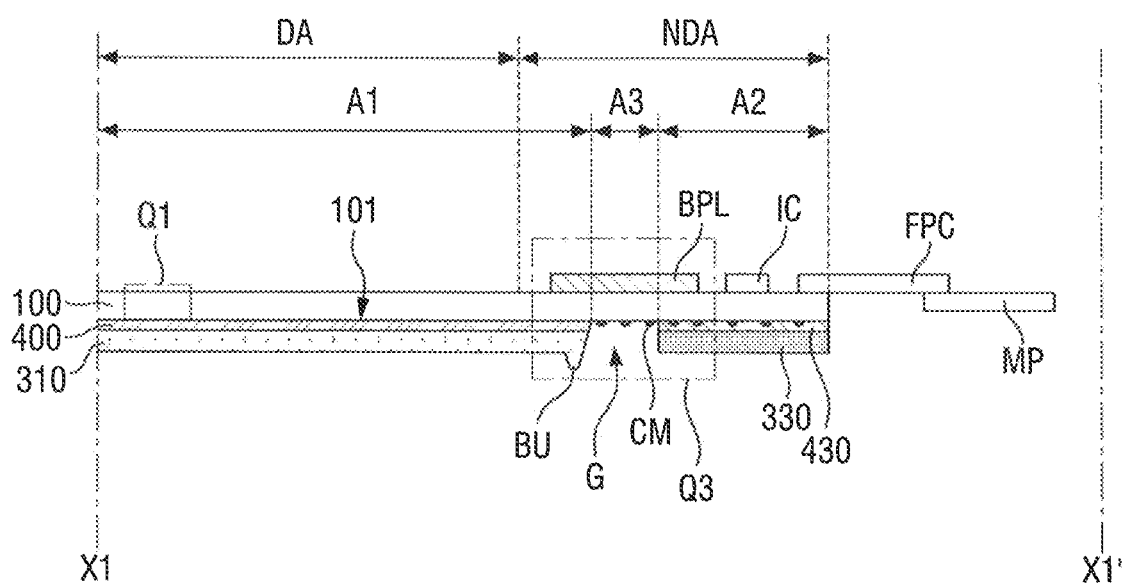
FIG. 6 is a cross-sectional view taken along line X1-X1' of FIGS. 2 and 3 according to an exemplary embodiment of the present inventive concept.
Figure 7:
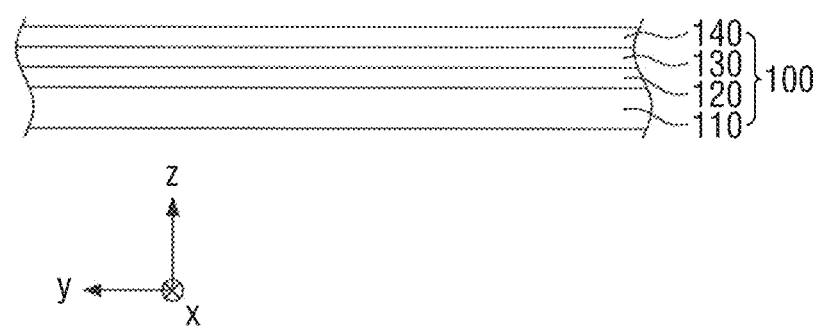
FIG. 7 is an enlarged view of a part Q1 of FIG. 6 and illustrates the stack structure of a display panel according to an exemplary embodiment of the present inventive concept.
Figure 8:
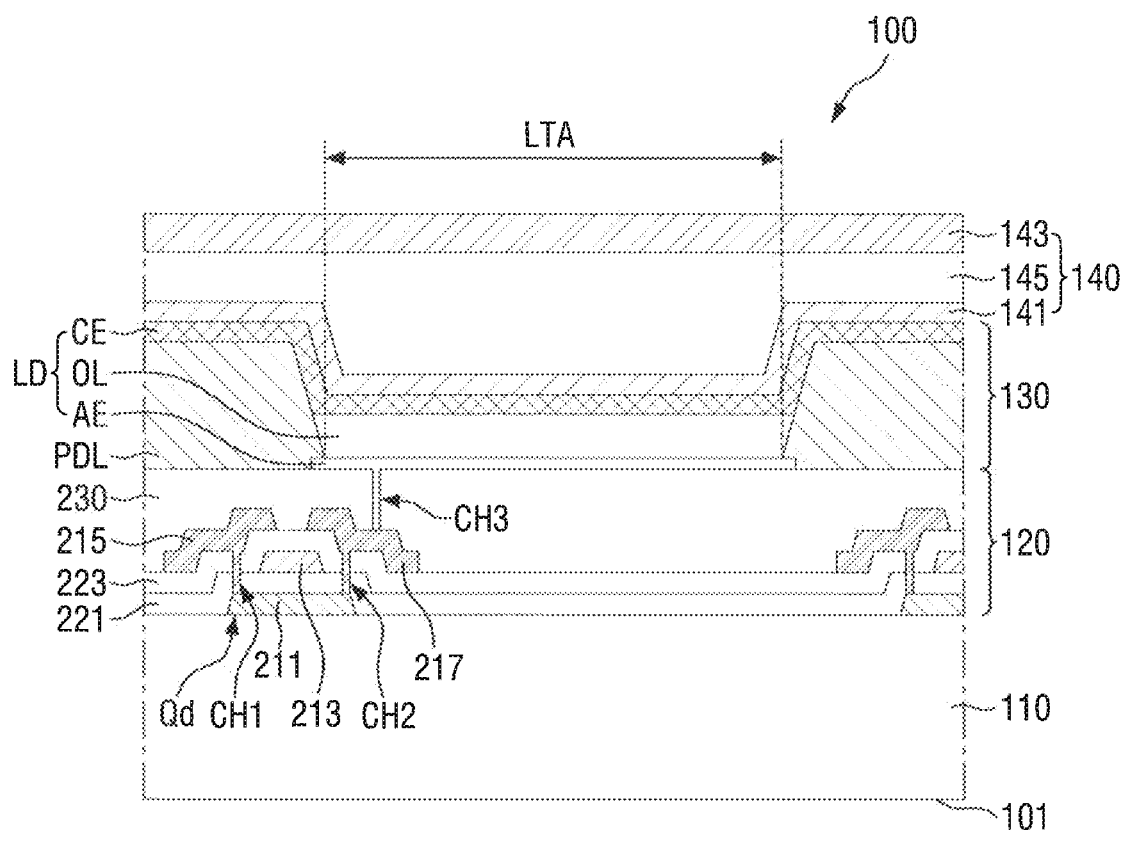
FIG. 8 is a cross-sectional view illustrating the structure of a display panel according to an exemplary embodiment of the present inventive concept.
Figure 9:
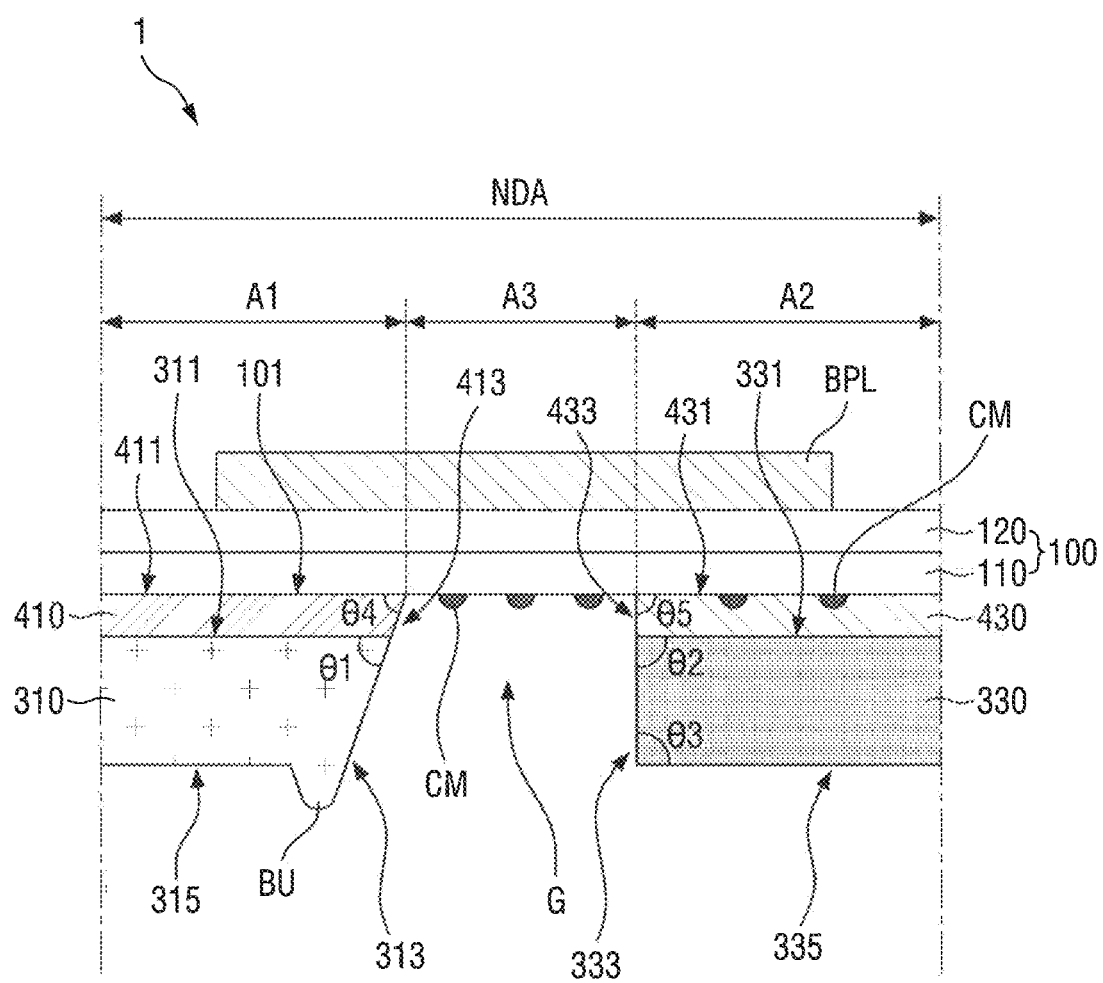
FIG. 9 is an enlarged cross-sectional view of a part Q3 of FIG. 6 according to an exemplary embodiment of the present inventive concept.

FIG. 6 is a cross-sectional view taken along line X1-X1' of FIGS. 2 and 3 according to an exemplary embodiment of the present inventive concept, FIG. 7 is an enlarged view of a part Q1 of FIG. 6 and illustrates the stack structure of the display panel 100 according to an exemplary embodiment of the present inventive concept, FIG. 8 is a cross-sectional view illustrating the structure of the display panel 100 according to an exemplary embodiment of the present inventive concept, and FIG. 9 is an enlarged cross-sectional view of a part Q3 of FIG. 6 according to an exemplary embodiment of the present inventive concept.

Referring to FIGS. 6 through 9, the display panel 100 of the display device 1 may include a base substrate 110, a driving layer 120, an OLED layer 130, and a thin-film encapsulation layer 140.

The base substrate 110 provides the bottom surface 101 of the display panel 100. The base substrate 110 may be a flexible substrate and may be formed of a polymer material with flexibility. For example, the base substrate 110 may be formed of a plastic material with excellent thermal resistance and durability such as PET, PEN, PC, polyarylate, polyetherimide, polyethersulfone, or PI. The base substrate 110 will hereinafter be described as comprising PI.

The driving layer 120 may include elements for providing signals to the OILED layer 130. The driving layer 120 may include various signal lines such as, for example, scan lines, data lines, power lines, and emission lines. The driving layer 120 may further include a plurality of transistors and a plurality of capacitors. The transistors may include a switching transistor and a driving transistors Qd, and the switching transistor and the driving transistor Qd may be provided in each of a plurality of pixels.

FIG. 8 illustrates the driving transistor Qd of the driving layer 120. Referring to FIG. 8, the driving transistor Qd includes an active layer 211, a gate electrode 213, a source electrode 215, and a drain electrode 217.

The active layer 211 may be disposed on the base substrate 110. In exemplary embodiments of the present inventive concept, the active layer 211 may comprise polycrystalline silicon. In other exemplary embodiments of the present inventive concept, the active layer 211 may comprise monocrystalline silicon, low-temperature polycrystalline silicon, or amorphous silicon. However, the present inventive concept is not limited thereto. In other words, alternatively, the active layer 211 may comprise an oxide semiconductor.

The driving layer 120 may further include a first insulating film 221 disposed on the active layer 211, and the gate electrode 213 may be disposed on the first insulating film 221.

The first insulating film 221 may insulate the active layer 211 and the gate electrode 213 from each other. In exemplary embodiments of the present inventive concept, the first insulating film 221 may comprise an inorganic insulating material such as silicon oxide, silicon nitride, or silicon oxynitride. The first insulating film 221 may be formed as a single-layer film or a multilayer film consisting of different materials.

The gate electrode 213 may be disposed on the first insulating film 221 to overlap with the active layer 211. The gate electrode 213 may comprise gold (Au), silver (Ag), copper (Cu), nickel (Ni), platinum (Pt), palladium (Pd), aluminum (Al), or molybdenum (Mo).

The driving layer 120 may further include a second insulating film 223 disposed on the gate electrode 213. The source electrode 215 and the drain electrode 217 may be disposed on the second insulating film 223.

The second insulating film 223 may comprise at least one of the insulating materials described above with regard to the first insulating film 221.

The source electrode 21 and the drain electrode 217 may be connected to the active layer 211 via contact holes CH1 and CH2, respectively, and the contact holes CH1 and CH2 may be formed in the first and second insulating films 221 and 223, respectively. In exemplary embodiments of the present inventive concept, the source electrode 215 and the drain electrode 217 may be formed as metallic multilayer films of Ti/Al/Ti, hut the present inventive concept is not limited thereto.

The driving layer 120 may further include a passivation film 230 disposed on the source electrode 215 and the drain electrode 217. In exemplary embodiments of the present inventive concept, the passivation film 230 may be a planarization film. For example, the passivation film 230 may comprise an organic insulating material, an inorganic insulating material, or a combination thereof.

FIG. 8 does not illustrate the switching transistor provided in each pixel. The switching transistor may have the same structure as, or a similar structure to, the driving transistor Qd, but the present inventive concept is not limited thereto. In other words, alternatively, the switching transistor and the driving transistor Qd may have different structures. For example, an active layer of the switching transistor and the active layer 211 of the driving transistor Qd may be disposed on different layers.

In exemplary embodiments of the present inventive concept, the driving layer 120 may be disposed not only in the display area DA, but also in the non-display area NDA of the display panel 100. In the non-display area NDA, particularly, in the part of the non-display area NDA included in the first area A1 and in the second and third areas A2 and A3, the driving layer 120 may include wires and pads electrically connected to the driving chip IC and may further include wires and pads electrically connected to the flexible printed circuit board FPC.

The OLED layer 130 may include an OLED LD as a self-luminous element. In exemplary embodiments of the present inventive concept, the OLED LD may be a top emission OLED and may emit light in an upward direction z.

The OLED LD may include a first electrode AE, an organic layer OL, and a second electrode CE.

The first electrode AE may be disposed on the passivation film 230. The first electrode AE is connected to the drain electrode 217 via a contact hole CH3 formed in the passivation film 230. The first electrode AE may be a pixel electrode or an anode. The first electrode AE may be a transflective electrode or a reflective electrode. In a case where the OLED LD is a top emission OLED, the first electrode AE may be a reflective electrode. In exemplary embodiments of the present inventive concept, the first electrode AE may comprise any one of Ag, Mg, Al, Pt, Pd, Au, Ni, Nd, Ir, Cr, and an alloy thereof.

The first electrode AE may have a multilayer structure consisting of a single layer or multiple layers formed of a metal oxide or a metal. For example, the first electrode AE may have a single-layer structure of ITO, Ag or a metal mixture (e.g., the mixture of Ag and Mg), a double-layer structure of ITO/Mg, or a triple-layer structure of ITO/Ag/ITO, but the present inventive concept is not limited thereto.

The organic layer OL may include an organic emission layer (EML) formed of a low-molecular organic material or a high-molecular organic material. The organic EML may emit light. The organic layer OL may further include a hole transport layer (HTL), a hole injection layer (HIL), an electron transport layer (ETL), or an electron injection layer (EIL).

Holes and electrons from the first and second electrodes AE and CE, respectively, may be injected into the organic EML of the organic layer OL. In the organic EML, the holes and electrons are combined to generate excitons, and as the excitons fall from an excited state to a ground state, light is emitted.

The second electrode CE may be provided on the organic layer OL. The second electrode CE may be a common electrode or a cathode. The second electrode CE may be a transmissive electrode or a transflective electrode. In a case where the second electrode CE is a transmissive electrode or a transflective electrode, the second electrode CE may comprise Li, Liq, Ca, LiF/Ca, LiF/Al, Al, Mg, BaF, Ba, Ag, or a compound or mixture thereof (e.g., the mixture of Ag and Mg).

The second electrode CE may include an auxiliary electrode. The auxiliary electrode may include a film formed through deposition to face the organic EML and a transparent metal oxide (e.g., indium tin oxide (ITO), indium zinc oxide (IZO), zinc oxide (ZnO), or indium tin zinc oxide (ITZO)) formed on the film, and may comprise Mo, Ti, or Ag.

The OLED layer 130 may further include a pixel-defining film PDL disposed on the passivation film 230. The pixel-defining film PDL may include an opening and may define a light-emitting area (LTA) in a plan view.

In exemplary embodiments of the present inventive concept, the OLED LD of the OLED layer 130 may be disposed in the display area DA of the display panel 100, but not in the non-display area NDA of the display panel 100. For convenience, the OLED layer 130 will hereinafter be described as not being disposed in the non-display area NDA.

The encapsulation layer 140 may be disposed on the OLED layer 130. The encapsulation layer 140 may block the OLED layer 130 from external moisture and external air.

In exemplary embodiments of the present inventive concept, the encapsulation layer 140 may be a thin-film encapsulation layer and may include one or more organic films and one or more inorganic films. For example, the encapsulation layer 140 may include a first inorganic film 141 disposed on the second electrode CE, an organic film 145 disposed on the first inorganic film 141, and a second inorganic film 143 disposed on the organic film 145.

The first inorganic film 141 may be disposed on the OLED LD and may prevent the infiltration of moisture and oxygen into the OLED LD. In exemplary embodiments of the present inventive concept, the first inorganic film 141 may comprise an inorganic material, and the inorganic material may be silicon oxide (SiOx), silicon nitride (SiNx), or silicon oxynitride (SiONx).

The organic film 145 may be disposed on the first inorganic film 141. The organic film 145 may promote flatness. The organic film 145 may comprise an organic material, and the organic material may be epoxy, acrylate, or urethane acrylate.

The second inorganic film 143 may be disposed on the organic film 145. The second inorganic film 143 may perform substantially the same function as, or a similar function to, the first inorganic film 141 and may include the same material as, or a similar material to, the first inorganic film 141. The second inorganic film 143 may completely cover the organic film 145. In exemplary embodiments of the present inventive concept, the first and second inorganic films 141 and 143 may be in contact with each other on the outside of the display area DA to form inorganic-inorganic bonding. In a case where the first and second inorganic films 141 and 143 form inorganic-inorganic bonding, the infiltration of external moisture or the like into the display device 1 can be prevented.

FIG. 8 illustrates the first inorganic film 141, the organic film 145, and the second inorganic film 143 as single-layer films, but the present inventive concept is not limited thereto. In other words, alternatively, at least one of the first inorganic film 141, the organic film 145, and the second inorganic, film 143 may have a multilayer structure.

In a case where at least one of the first and second inorganic, films 141 and 143 has a multilayer structure, at least one layer of the multilayer structure may be a hexamethyldisiloxane (HMDSO) layer. The HMDSO layer may absorb stress. Accordingly, the encapsulation layer 140 may become more flexible. Alternatively, the organic film 145 may be replaced with an HMDSO layer.

The encapsulation layer 140 may not completely cover the non-display area NDA of the display panel 100. For example, the encapsulation layer 140 may not be disposed in the first area A1 of the display panel 100, particularly, a part of the first area A1 between the third area A3 and the display area DA. In addition, the encapsulation layer 140 may not be disposed in the second and third areas A2 and A3. Alternatively, the encapsulation layer 140 may be disposed in the part of the first area A1 between the third area A3 and the display area DA, but not in the second and third areas A2 and A3. For convenience, the encapsulation layer 140 will hereinafter be described as being disposed in the display area DA of the display panel 100, but not in the part of the first area A1 between the third area A3 and the display area DA and in the second and third areas A2 and A3.

As described above, in the first area A1, the first bonding layer 410 is disposed on the bottom surface 101 of the display panel 100, and the first support film 310 is disposed below the first bonding layer 410. In addition, in the second area A2, the second bonding layer 430 is disposed on the bottom surface 101 of the second area A2, and the second support film 330 is disposed below the second bonding layer 430.

The gap G is disposed between the first and second bonding layers 410 and 430 and between the first and second support films 310 and 330, and the gap G is disposed to correspond to the third area A3 of the display panel 100. In other words, the gap G is disposed in the third area A3.

The first support film 310 may include an inner side 313 which is near the gap G, a top surface 311 which faces the first bonding layer 410 or the display panel 100, and a bottom surface 315 which is opposite to the top surface 311.

The second support film 330 may include an inner side 333 which is near the gap G, a top surface 331 which faces the second bonding layer 430 or the display panel 100, and a bottom surface 335 which is opposite to the top surface 331.

The first bonding layer 410 may include an inner side 413 which is near the gap G, a top surface 411 which faces the display panel 100, and a bottom surface which is opposite to the top surface 411. The bottom surface of the first bonding layer 410 may be in contact with the top surface 311 of the first support film 310. For example, the bottom surface of the first bonding layer 410 may directly contact the top surface 311 of the first support film 310.

The second bonding layer 430 may include an inner side 433 which is near the gap G, a top surface 431 which faces the display panel 100, and a bottom surface which is opposite to the top surface 431. The bottom surface of the second bonding layer 430 may be in contact with the top surface 331 of the second support film 330. For example, the bottom surface of the second bonding layer 430 may directly contact the top surface 411 of the second support film 330.

The gap G may be defined by the inner side 413 of the first bonding layer 410, the inner side 433 of the second bonding layer 430, the inner side 313 of the first support film 310, and the inner side 333 of the second support film 330. In other words, the gap G may be between the inner side 413 of the first bonding layer 410 and the inner side 433 of the second bonding layer 430, and between the inner side 313 of the first support film 310 and the inner side 333 of the second support film 330.

In exemplary embodiments of the present inventive concept, a first angle θ1 that the top surface 311 and the inner side 313 of the first support film 310 form with each other may be an acute angle. A second angle θ2 that the top surface 331 and the inner side 333 of the second support film 330 form with each other may be different from the first angle θ1. In exemplary embodiments of the present inventive concept, the second angle θ2 may be greater than the first angle θ1.

The first support film 310 may be formed by a laser irradiation process, and laser light may be provided toward the bottom surface 315 of the first support film 310. Accordingly, the bottom surface 315 of the first support film 310 may receive a larger amount of laser energy than the top surface 311 of the first support film 310. As a result, the first angle θ1 may be an acute angle.

The second support film 330 may be formed by a cutting process using a cutting knife and may then be coupled to the display panel 100. Accordingly, the second angle θ2 may be greater than the first angle θ1.

In exemplary embodiments of the present inventive concept, the top surface 331 and the inner side 333 of the second support film 330 may be substantially orthogonal to each other. In other words, the second angle θ2 may be a right angle, but the present inventive concept is not limited thereto. For example, the second angle θ2 may be greater than the first angle θ1, but less than 90 degrees.

In exemplary embodiments of the present inventive concept, the sum of the second angle θ2 and a third angle θ3 that the bottom surface 335 and the inner side 333 of the second support film 330 form with each other may be about 180 degrees. For example, when the second angle θ2 is about 90 degrees, the third angle θ3 may also be 90 degrees. In this example, the second support film 330 may have a rectangular cross-sectional shape.

In exemplary embodiments of the present inventive concept, a fourth angle θ4 that the top surface 411 and the inner side 413 of the first bonding layer 410 form with each other may be an acute angle. A fifth angle θ5 that the top surface 431 and the inner side 433 of the second bonding layer 430 form with each other may be different from the fourth angle θ4. In exemplary embodiments of the present inventive concept, the fifth angle θ5 may be greater than the fourth angle θ4.

The first bonding layer 410, like the first support film 310, may be formed by a laser irradiation process, and the second bonding layer 430, like the second support film 330, may be formed by a cutting process using a cutting knife. Accordingly, the fifth angle θ5 may be greater than the fourth angle θ4. For example, the fifth angle θ5 may be a right angle.

In exemplary embodiments of the present inventive concept, the first and fourth angles θ1 and θ4 may be substantially the same, and the second and fifth angles θ2 and θ5 may be substantially the same. In this case, the fifth angle θ5 may be greater than the first angle θ1, and the second angle θ2 may be greater than the fourth angle θ4.

In exemplary embodiments of the present inventive concept, as mentioned above, the first support film 310 may further include the burr pattern BU disposed near the gap G. The burr pattern BU may protrude downward from a part of the bottom surface 315 of the first support film 310 that is substantially parallel to the bottom surface 101 of the display panel 100.

The second support film 330 may not include the burr pattern BU disposed near the gap G. In this case, the burr pattern BU of the first support film. 310 is disposed at a level below the bottom surface 335 of the second support film 330.

The gap G may be disposed between the first and second support films 310 and 330 and between the first and second bonding layers 410 and 430 to correspond with the third area A3 of the display panel 100.

In exemplary embodiments of the present inventive concept, the width, in the second direction y, of the gap C may gradually decrease closer to the display panel 100. For example, the width of the gap C may gradually decrease due to the slanted shape of the inner side 313 of the first support film 310 and the slanted shape of the inner side 413 of the first bonding layer 410.

In the second and third areas A2 and A3, the carbide CM may be disposed on the bottom surface 101 of the display panel 100.

In the second area A2, the carbide CM may be disposed between the bottom surface 101 of the display panel 100 and the second support film 330. More particularly, the carbide CM may be disposed between the bottom surface 101 of the display panel 100 and the second bonding layer 430, in the second area A2. In the second area A2, the carbide CM may be in direct contact with the bottom surface 101 of the display panel 100 and the second bonding layer 430. For example, the carbide CM may directly contact the top surface 431 of the second bonding layer 430.

In the third area A3, the carbide CM may be in contact with the bottom surface 101 of the display panel 100 and may be exposed through the gap C.

As mentioned above, during the manufacture of the display device 1, a laser irradiation process may be performed on a support film for forming the first support film 310, and laser light may be applied to parts of the support film corresponding to the second and third areas A2 and A1 The base substrate 110 of the display panel 100 may be formed of a polymer material with flexibility. Accordingly, during a laser irradiation process, the base substrate 110 of the display panel 100 or the first bonding layer 410 may be partially carbonized so that the carbide CM may remain on the bottom surface 101 of the display panel 100.

As mentioned above, in the first area A1, the carbide CM may not be disposed on the bottom surface 101 of the display panel 100 because the first area A1 is not irradiated with laser light during the manufacture of the display device 1. In exemplary embodiments of the present inventive concept, the carbide CM may not be in contact with a part of the first bonding layer 410 overlapping with the display area DA. Alternatively, the carbide CM may not be in contact with the entire first bonding layer 410 or may be in contact only with a part of the first bonding layer 410 near the gap G.

Since the carbide CM is disposed in the second and third areas A2 and A3, but not in the first area A1, the light transmittance of the base substrate 110 of the display panel 100 may differ from one area to another area. For example, the light transmittance of the base substrate 110 may be higher in the first area A1 than in the second and third areas A2 and A3.

In the non-display area NDA of the display panel 100, a neutral plane adjustment layer BPL may be disposed. The neutral plane adjustment layer BPL may overlap with the non-display area NDA, particularly, the third area A3, which is bendable. In exemplary embodiments of the present inventive concept, the neutral plane adjustment layer BPL may partially overlap with the first and second areas A1 and A2.

The neutral plane adjustment layer BPL can prevent wires in the driving layer 120 from cracking by reducing stress applied to the driving layer 120 in the third area A3, which is bendable. For example, the driving layer 120 may include wires passing through the part of the non-display area NDA included in the first area A1 and through the third area A3, and the elements in the driving layer 120 may be electrically connected to the driving chip IC via the wires. The neutral plane adjustment layer BPL adjusts the position of a neutral plane such that tensile stress cannot act on the wires disposed in the third area A3. The neutral plane is a plane where neither compressive stress nor tensile stress acts when the display panel 100 is bent in the third area A3. For example, when the display panel 100 is bent in the third area A3, compressive stress acts on the inside of the curvature of the display panel 100, and tensile stress acts on the outside of the curvature of the display panel 100. Thus, the direction of the stress gradually changes from a compression direction to a tensile direction along a direction from the inside to the outside of the curvature of the display panel 100. There exists a critical point where neither compressive stress nor tensile stress acts, and thus, the critical point becomes the neutral plane. By adjusting the position of the neutral plane with the neutral plane adjustment layer BPL, compressive stress can be applied to the wires in the driving layer 120, and as a result, the risk of cracking can be reduced.

In exemplary embodiments of the present inventive concept, the neutral plane adjustment layer BPL may be formed of an organic material. For example, the organic material may be a photosensitive organic material. For example, the neutral plane adjustment layer BPL may be an acrylic material.

In exemplary embodiments of the present inventive concept, the neutral plane adjustment layer BPL may include a part overlapping with the first area A1 and a part overlapping with the second area A2. In exemplary embodiments of the present inventive concept, the part of the neutral plane adjustment layer BPL overlapping with the first area A1 may overlap with the first support film 310 and the first bonding layer 410. In addition, the part of the neutral plane adjustment layer BPL overlapping with the first area A1 may overlap with the burr pattern BU of the first support film 310. In exemplary embodiments of the present inventive concept, the part of the neutral plane adjustment layer BPL overlapping with the second area A2 may overlap with the second support film 330 and the second bonding layer 430.

The neutral plane adjustment layer BPL is illustrated as being spaced apart from the driving chip IC, but the present inventive concept is not limited thereto. In other words, alternatively, the neutral plane adjustment layer BPL may extend to the location where the driving chip IC is disposed and may thus cover a part of the driving chip IC, in this case, the reliability of the bonding between the driving chip IC and the display panel 100 can be increased.

Figure 10:
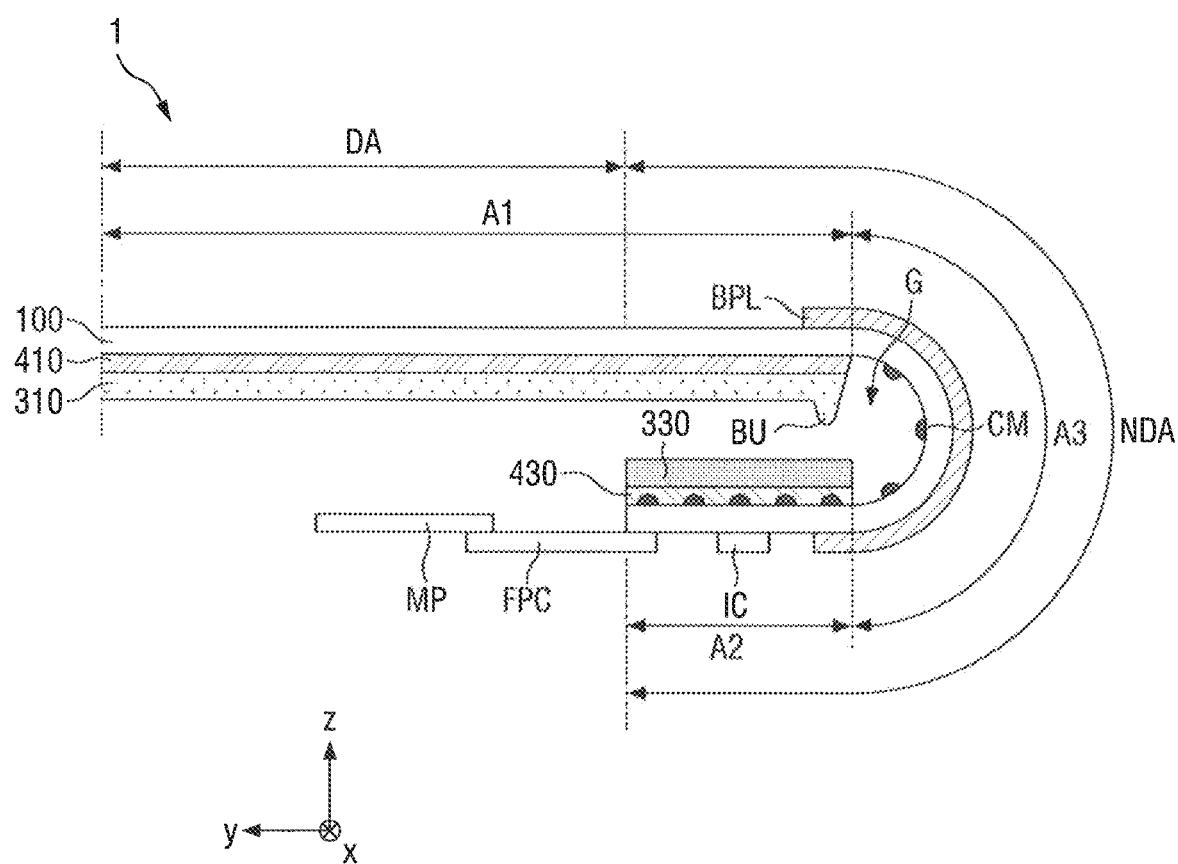
FIG. 10 is a cross-sectional view illustrating a state in which a display device of FIG. 6 is bent in a non-display area thereof.
Figure 11:
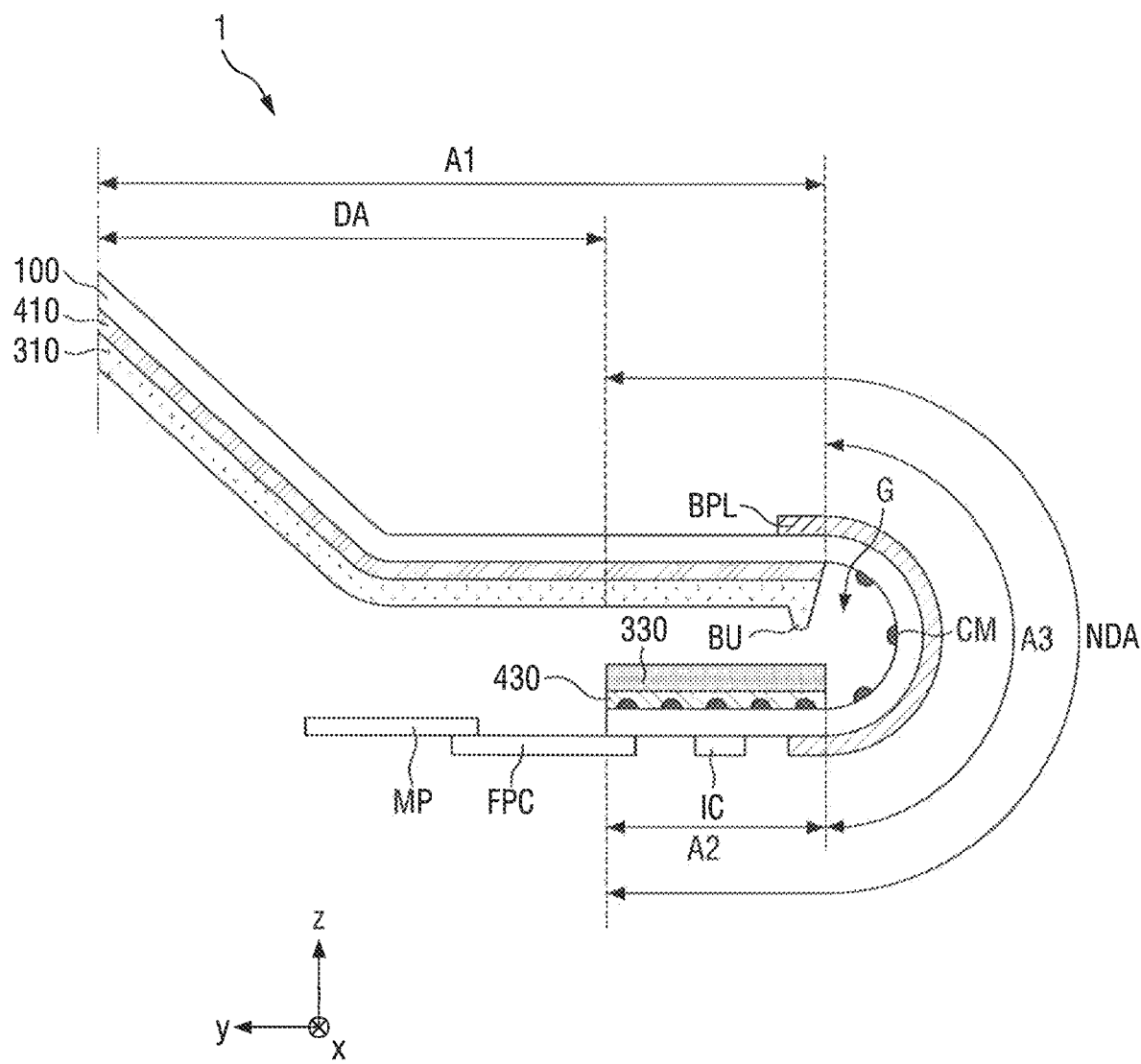
FIG. 11 is a cross-sectional view illustrating a state in which a display device of FIG. 6 is bent in a display area thereof and a non-display area thereof.
Figure 12:
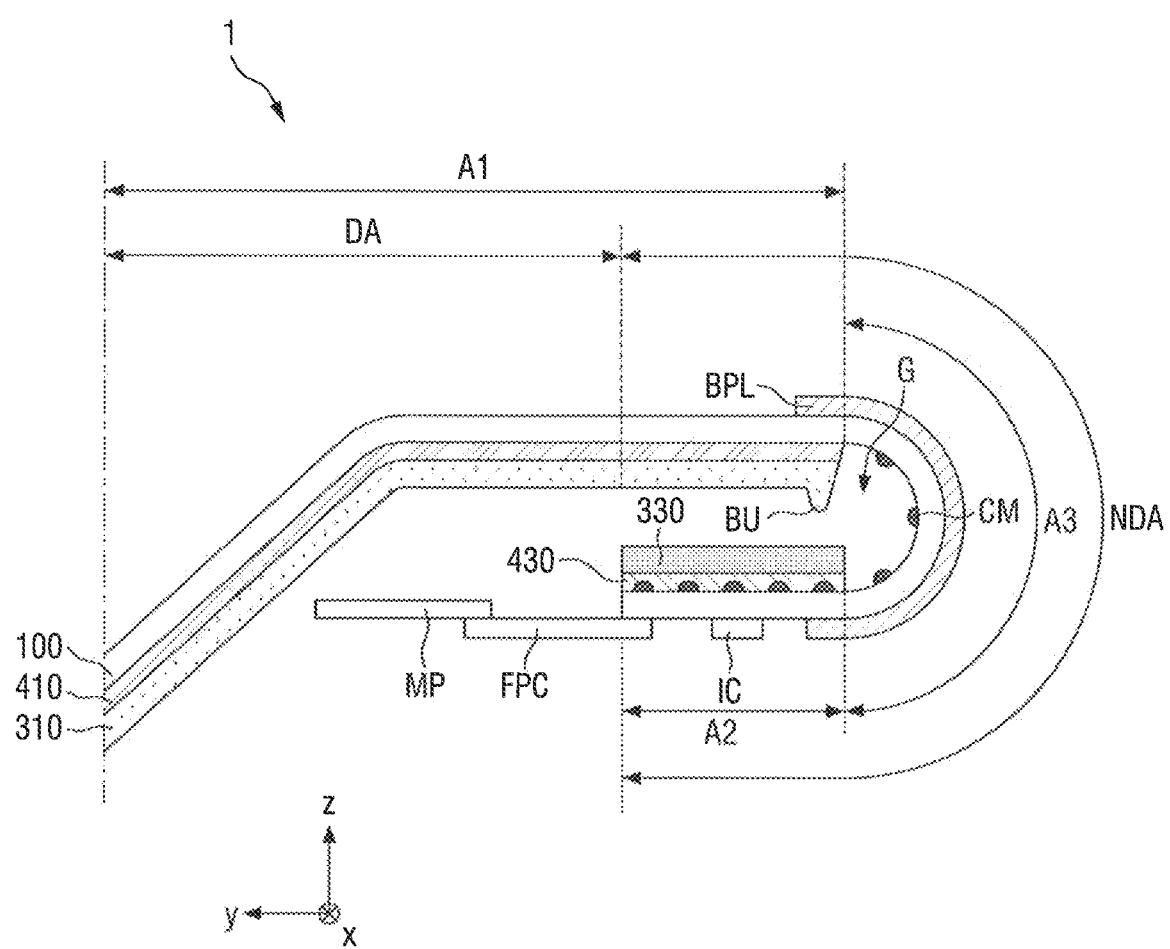
FIG. 12 is a cross-sectional view illustrating a state in which a display device of FIG. 6 is folded in a display area thereof and bent in a non-display area thereof.

FIG. 10 is a cross-sectional view illustrating, a state in which the display device of FIG. 6 is bent, particularly, a state in which the display device of FIG. 6 is bent in a non-display area thereof. FIG. 11 is a cross-sectional view illustrating a state in which the display device of FIG. 6 is bent, particularly, a state in which the display device of FIG. 6 is folded in a display area thereof and is bent in the non-display area thereof. FIG. 12 is a cross-sectional view illustrating a state in which the display device of FIG. 6 is bent, particularly, a state in which the display device of FIG. 6 is folded in a display area thereof and is bent in the non-display area thereof.

Referring to FIGS. 10, 11 and 12, the display panel 100 of the display device 1 may be bent downwardly in the third area A3 along the bending axis BX of FIG. 1, which extends in the first direction x. Since the gap G is located between the first and second support films 310 and 330 to overlap with the third area A3, the display panel 100 can be easily bent.

As the display panel 100 is bent in the non-display area NDA, the size of the non-display area NDA, as viewed away from the display device 1, can be reduced, and the bezel width of the display device 1 can also be reduced. In addition, since the neutral plane adjustment layer BPL is disposed on the display panel 100 to overlap with the third area A3, the wires in the display panel 100 can be prevented from cracking in the third area A3, and the reliability of the display device 1 can be increased.

The display panel 100 of the display device 1 may be folded or bent in the first area A1 or the display area DA along the folding axis FX, which extends in the first direction x. For example, the display panel 100 may be folded in an upward direction, which is the direction facing the display surface of the display panel 100, as illustrated in FIG. 11, or may be bent in the opposite direction to the display surface, e.g., a downward direction, as illustrated in FIG. 12. In other words, the display device 1 may be implemented as an inside folding-type foldable display device or as an outside folding-type foldable display device.

Figure 13:
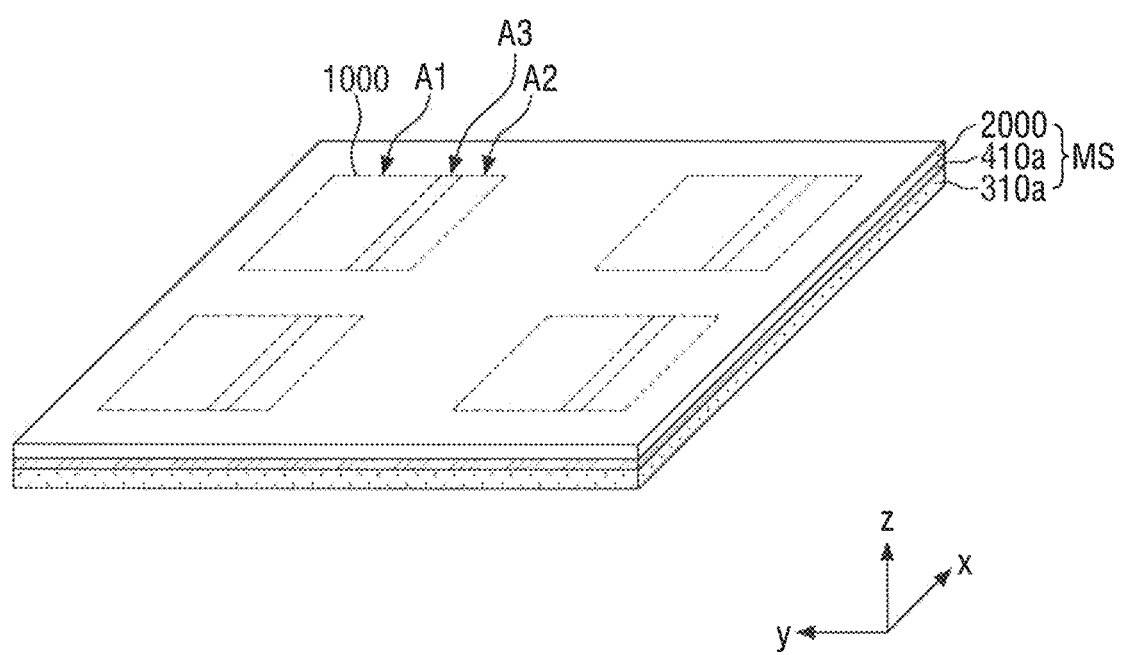
FIG. 13 is a perspective view of a mother substrate for a display device, according to an exemplary embodiment of the present inventive concept.
Figure 14:
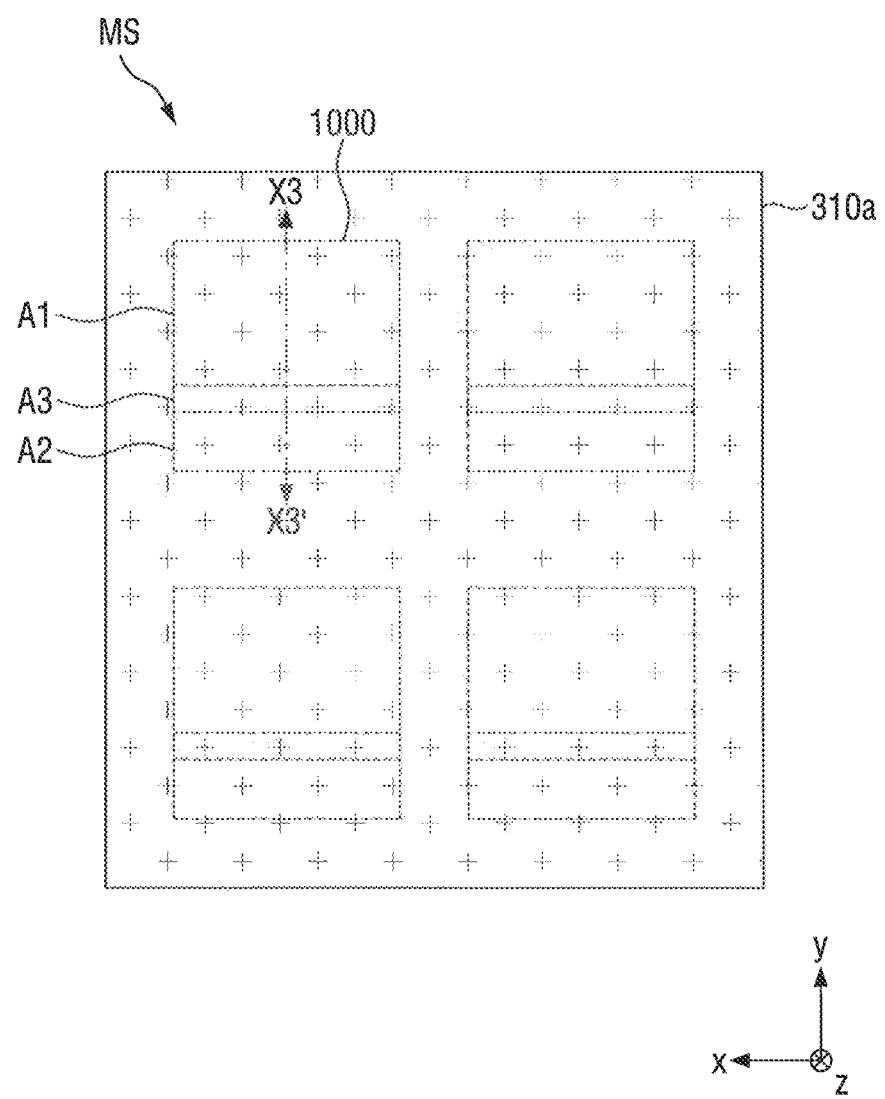
FIG. 14 is a rear view of the mother substrate of FIG. 13.

FIG. 13 is a perspective view of a mother substrate for a display device, according to an exemplary embodiment of the present inventive concept, FIG. 14 is a rear view of the mother substrate of FIG. 13, and FIGS. 15, 16, 17, 18, and 19 are cross-sectional views taken along line X3-X3' of FIG. 14 and illustrate steps of the manufacture of a display device, according to an exemplary embodiment of the present inventive concept.

The manufacture of a display device will hereinafter be described with reference to FIGS. 13 through 17.

First, referring to FIGS. 13 and 14, a mother substrate structure MS is fabricated by forming a mother substrate 2000, forming a bonding layer 410a on the bottom surface of the mother substrate 200, and coupling a first support film 310a to the bonding layer 410a. In this case, the first support film 310a may be in a "sheet unit" state.

The mother substrate 200 may include a plurality of display cells 1000 and a dummy area which accounts for the entire mother substrate 200 except for the display cells 1000. The display cells 1000 may share a single substrate, and the display cells 1000 may be separated from the mother substrate 2000 and may thus become individual display panels 100. In other words, the display cells 1000 may have the same cross-sectional stack structure as the display panel 100 of FIGS. 7 and 8. Each of the display cells 1000 may include a first area A1, a second area A2, and a third area A3.

The dummy area may be disposed between the display cells 1000. The dummy area may be disposed in the periphery of each of the display cells 1000 and may surround each of the display cells 1000. The dummy area may be an area that is finally removed in the process of manufacturing a display device.

Figure 15:
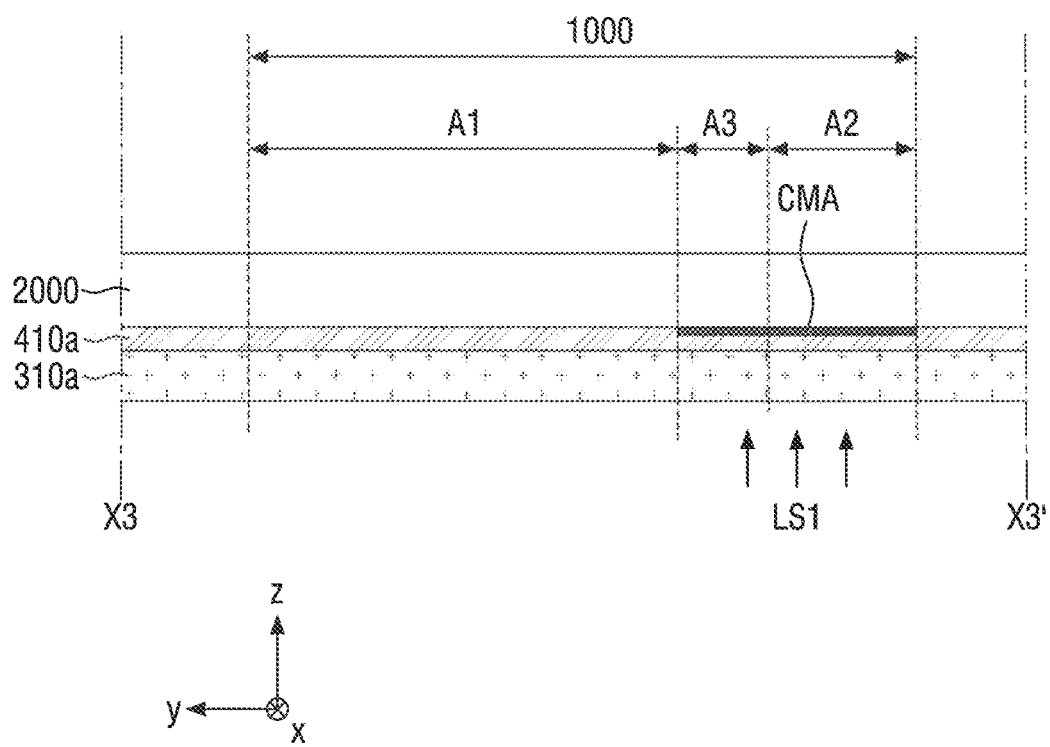
FIGS. 15, 16, 17, 18, and 19 are cross-sectional views taken along line X3-X3' of FIG. 14 and illustrate steps of the manufacture of a display device, according to an exemplary embodiment of the present inventive concept.

Thereafter, referring to FIG. 15, laser light LS1 is applied from below the first support film 310a. For example, the laser light LS1 may be selectively applied to parts of the first support film 310a overlapping with the second and third areas A2 and A3, but not to the first area A1.

In exemplary embodiments, of the present inventive concept the laser light LS1 may be ultraviolet (UV) laser light.

As the laser light LS1 is applied, the adhesion between the mother substrate 2000 and the bonding layer 410a may weaken in the second and third areas A2 and A3. For example, when the laser light LS1 is applied to the parts of the boding layer 410a overlapping with the second and third areas A2 and A3, the adhesion between the mother substrate 2000 and the bonding layer 410a may weaken in the second and third areas A2 and A3 because of a carbide layer CMA being formed on the bottom surface of the mother substrate 2000 or on the bonding layer 410a. The adhesion between the mother substrate 2000 and the bonding layer 410a may also weaken in the second and third areas A2 and A3 because of a base substrate of the mother substrate 2000 swelling up.

If the adhesion between the mother substrate 2000 and the bonding layer 410a fails to weaken in the second and third areas A2 and A3, parts of the first support film 310a corresponding to the second and third areas A2 and A3 may not be able to be properly removed. In addition, if the adhesion between the mother substrate 2000 and the bonding layer 410a fails to weaken in the second and third areas A2 and A3, the base substrate 110 of the mother substrate 2000 may be damaged in the process of removing parts of the first support film 310a or parts of the bonding layer 410. However, in the exemplary embodiment of the present inventive concept illustrated in FIGS. 13 through 19, since the adhesion of the bonding layer 410a is made to selectively weaken through the application of the laser light LS1, parts of the first support film 310a and the bonding layer 410a can be stably removed later.

The laser light LS1 may also be applied to parts of the first support film 310a and the bonding layer 410a in parts of the dummy area extended from the second and third areas A2 and A3.

Figure 16:
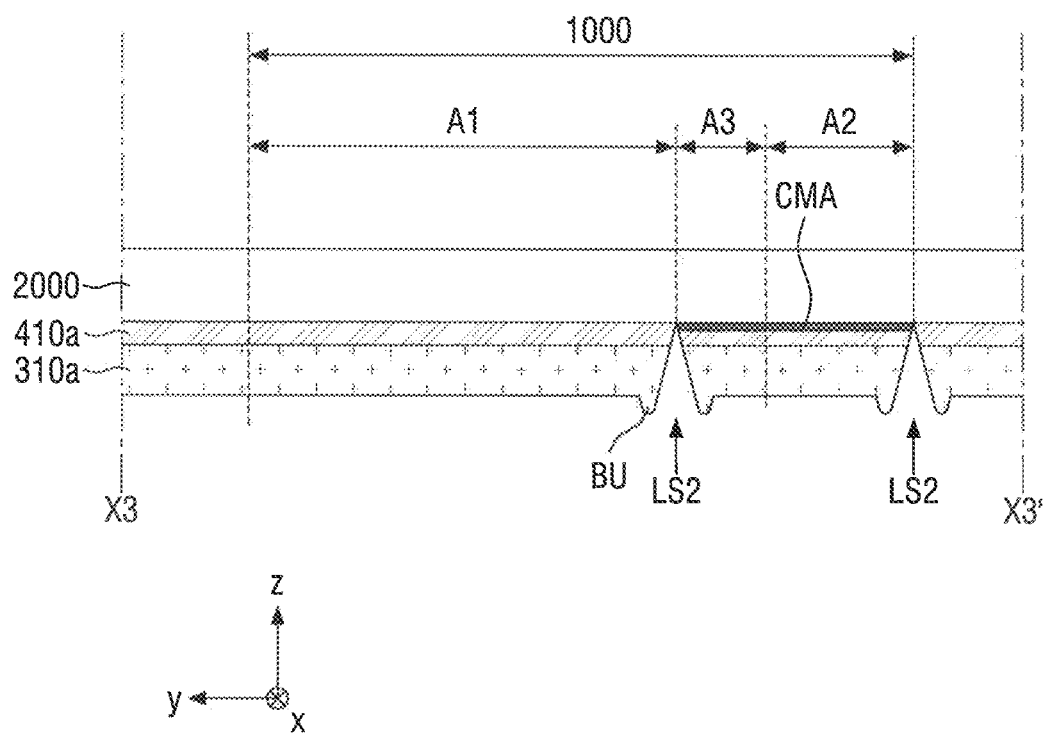

Thereafter, referring to FIG. 16, laser light LS2 is applied from below the first support film 310a, which is in a "sheet unit" state, to a boundary between the first and third areas A1 and A3 and an edge of the second area A2 on the opposite side of the third area A3, thereby cutting the bonding layer 410a and the first support film 310a.

In exemplary embodiments of the present inventive concept, the laser light L2 may be $CO_2$ laser light having a high energy efficiency.

Burr patterns BU may be formed on the bottom surface of the first support film 310a in the process of applying the laser light LS2. The burr patterns BU may be formed along the boundary between the first and third areas A1 and A3 and along the edge of the second area A2. Parts of the first support film 310a may be melted by the thermal energy of the laser light LS2, and as a result, the burr patterns BU may be formed.

The laser light LS2 may also be applied to parts of the first support film 310a and the bonding layer 410a that fall on lines extended from the boundary between the first and third areas A1 and A3 and from the edge of the second area A2.

Figure 17:
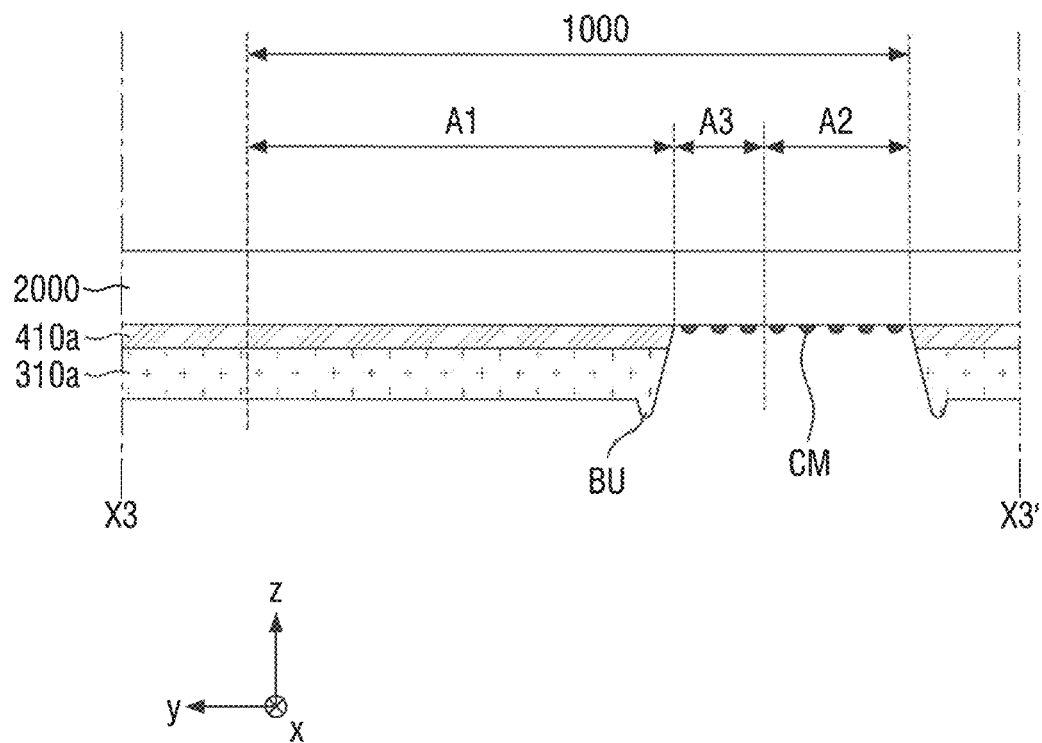

Thereafter, referring to FIG. 17, parts of the bonding layer 410a and the first support film 310a overlapping with the second and third areas A2 and A3 are removed. In exemplary embodiments of the present inventive concept, a part of the carbide layer CMA may remain. Accordingly, carbides CM, which are residues of the carbide layer CMA, may be disposed on the bottom surface of the mother substrate 2000 in the second and third areas A2 and A3.

The parts of the first support film 310a and the bonding layer 410a in the areas extended from the second and third areas A2 and A3 may also be removed.

Figure 18:
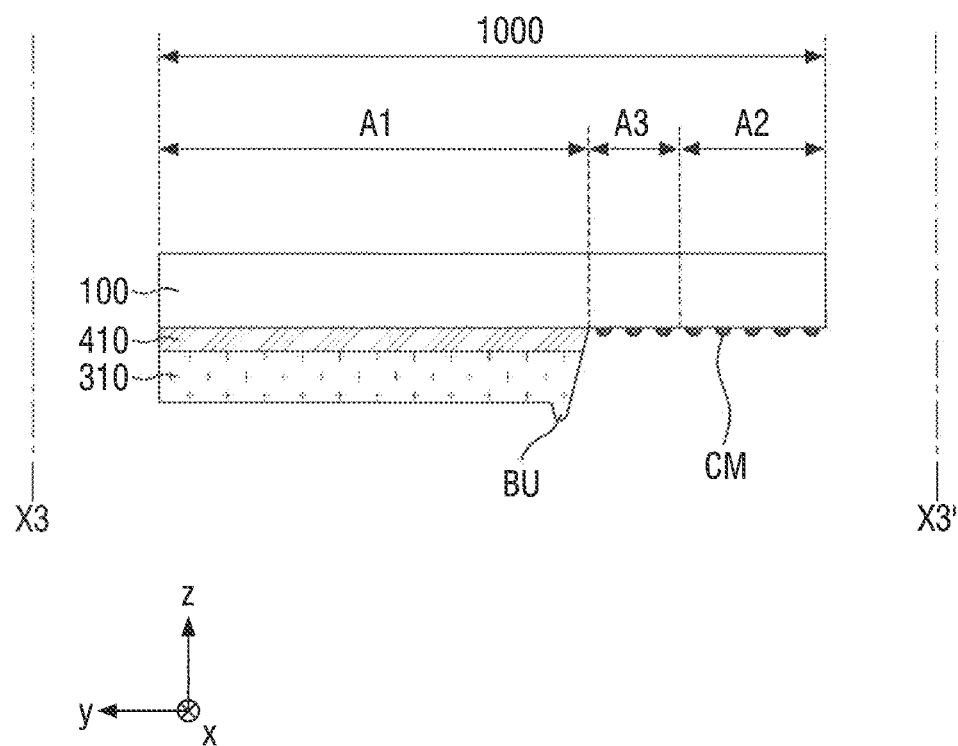

Thereafter, referring to FIG. 18, parts of the mother substrate structure MS corresponding to the dummy area are removed, thereby separating a display cell 1000. The display cell 1000 may include a display panel 100, a first bonding layer 410, and a first support film 310 and may further include a carbide CM.

Figure 19:
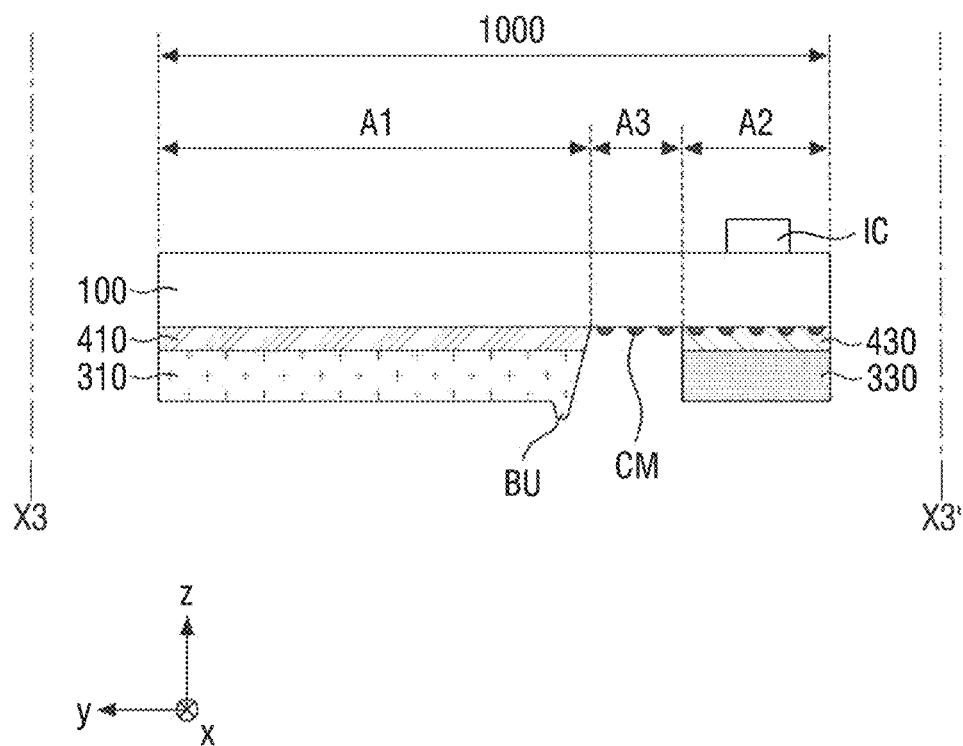

Thereafter, referring to FIG. 19, a second bonding layer 430 and a second support film 330 are coupled to the bottom surface of the display panel 100 in the second area A2. In exemplary embodiments of the present inventive concept, the second support film 330 may be formed on one surface of the second bonding layer 430 as a tape. Since the carbide GM is disposed on the bottom surface of the display panel 100 in the second area A2, the second bonding layer 430 may be in direct contact with the carbide CM.

Thereafter, a driving chip IC may be mounted on the top surface of the display panel 100 in the second area A2, a flexible printed circuit board (FPC of FIG. 6) is coupled to the display panel 100, and a neutral plane adjustment layer (BPL of FIG. 6) is formed to overlap with the third area A3. In this manner, the display device of FIG. 6 can be obtained.

Thereafter, by bending the display panel 100 downwardly in the third area A3, the display device of FIG. 10 can be obtained.

According to the exemplary embodiment of present inventive concept illustrated in FIGS. 13 through 19, since each display cell 1000 is separated by removing the bonding layer 410a and the first support film 310a from the mother substrate structure MS at once, the manufacture of a display device can be simplified. In addition, the second bonding layer 430 and the second support film 330 are coupled to the display panel 100 using, for example, an adhesive tape; therefore, the manufacture of a display device can be further simplified.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A display device, comprising:
   a display panel including a first area, which includes a display area, a second area, which is spaced apart from the first area in a first direction, and a third area, which is disposed between the first area and the second area, the third area being bent;
a first support film coupled to a bottom surface of the display panel and overlapping the first area; and
a second support film coupled to the bottom surface of the display panel, overlapping the second area, and spaced apart from the first support film by a gap, the gap overlapping the third area,
wherein
the first support film and tale second support film include different materials from each other,
a top surface of the first support film facing the display panel and an inner side of the first support film form a first angle, the inner side of the first support film being disposed alongside the gap,
a top surface of the second support film facing the display panel and an inner side of the second support film form a second angle, which is greater than the first angle, the inner side of the second support film being disposed alongside the gap,
the first support film includes, near the gap, a protruding pattern protruding beneath a bottom surface of the first support film, and
the first support film and the second support film are bonded to the display panel by different materials.

2. The display device of claim 1, wherein
an edge of the top surface of the first support film extends in a second direction, which intersects the first direction, an edge of the top surface of the second support film extends in the second direction,
the edge of the top surface of the first support film is curved in a plan view, and
the edge of the top surface of the second support film is arranged in a straight line parallel to the second direction in a plan view.

3. The display device of claim 1, wherein a tensile modulus of the second support film is greater than a tensile modulus of the first support film.

4. The display device of claim 3, further comprising:
a driving chip disposed in the second area and mounted on the display panel,
wherein the driving chip overlaps the second support film.

5. The display device of claim 1, wherein
the second support film includes polyethylene terephthalate, polycarbonate, or polymethyl methacrylate, and
the first support film includes polyethylene naphthalate, polyimide, polyethylene sulfide, polyamide, or aramid.

6. The display device of claim 1, further comprising:
a first bonding layer disposed between the display panel and the first support film; and
a second bonding layer disposed between the display panel and the second support film and spaced apart from the first bonding layer in the first direction,
wherein the first bonding layer and the second bonding layer include different materials from each other.

7. The display device of claim 6, wherein a storage modulus of the second bonding layer is greater than a storage modulus of the first bonding layer.

8. The display device of claim 6, wherein
the first bonding layer includes a silicone-based resin, and
the second bonding layer includes an acrylic resin.

9. The display device of claim 6, wherein
a top surface of the first bonding layer facing the display panel and an inner side of the first bonding layer form a third angle, the inner side of the first bonding layer being disposed alongside the gap, and
a top surface of the second bonding layer facing the display panel and an inner side of the second bonding layer form a fourth angle, which is different from the third angle, the inner side of the second bonding layer being disposed alongside the gap.

10. The display device of claim 9, wherein the fourth angle is greater than the third angle.

11. The display, device of claim 6, further comprising:
a carbide disposed on the bottom surface of the display panel,
wherein the carbide contacts the second bonding layer.

12. The display device of claim 11, wherein the carbide is further disposed on a part of the bottom surface of the display panel exposed through the gap in the third area.

13. The display device of claim 11, wherein the carbide, is not disposed on the bottom surface of the display panel in the first area.

14. The display device of claim 1, further comprising:
a carbide disposed on the bottom surface of the display panel,
wherein
the display panel includes a flexible substrate, which forms the bottom surface of the display panel, a self-luminous element, which is disposed on the flexible substrate in the display area, and a thin-film encapsulation layer, which covers the self-luminous element, and
the carbide is disposed on parts of the flexible substrate corresponding to the second and third areas.

15. The display device of claim 1, further comprising:
a neutral plane adjustment layer disposed on the display panel and overlapping the third area,
wherein the neutral plane adjustment layer overlaps the protruding pattern, and wherein the protruding pattern is a burr pattern.

16. The display device of claim 1, wherein the first angle is an acute angle.

17. A display device, comprising:
a display panel including a first area, which includes a display area, a second area, which is spaced apart from the first area in a first direction, and a third area, which is disposed between the first area and the second area, the third area being bent;
a first support film coupled to a bottom surface of the display panel and overlapping the first area; and
a second support film coupled to the bottom surface of the display panel, overlapping the second area, and spaced apart from the first support film by a gap, the gap overlapping the third area,
wherein
the first support film and the second support film include different materials from each other,
a top surface of the first support film facing the display panel and an inner side of the first support film form a first angle, the inner side of the first support film being disposed alongside the gap,
a top surface of the second support film facing the display panel and an inner side of the second support film form a second angle, which is greater than the first angle, the inner side of the second support film being disposed alongside the gap,
wherein the display device further comprises:
a first bonding layer disposed between the display panel and the first support film; and
a second bonding layer disposed between the display panel and the second support film, wherein the first bonding layer and the second bonding layer include different materials from each other.

18. The display device of claim 17, wherein a storage modulus of the second bonding layer is greater than a storage modulus of the first bonding layer.

19. The display device of claim 17, wherein
the first bonding layer includes a silicone-based resin, and
the second bonding layer includes an acrylic resin.

20. The display device of claim 17, wherein
a top surface of the first bonding layer facing the display panel and an inner side of the first bonding layer form a third angle, the inner side of the first bonding layer being disposed alongside the gap, and
a top surface of the second bonding layer facing the display panel and an inner side of the second bonding layer form a fourth angle, which is different from the third angle, the inner side of the second bonding layer being disposed alongside the gap.

21. The display device of claim 20, wherein the fourth angle is greater than the third angle.

22. The display device of claim 1, wherein the protruding pattern protrudes downward from the bottom surface of the first support film, the bottom surface of the first support film being substantially parallel to the bottom surface of the display panel.

* * * * *